(12) United States Patent
Ahn et al.

(10) Patent No.: US 12,033,545 B2
(45) Date of Patent: *Jul. 9, 2024

(54) DISPLAY DEVICE AND METHOD OF PROVIDING THE SAME

(71) Applicant: Samsung Display Co., LTD., Yongin-si (KR)

(72) Inventors: Yi Joon Ahn, Seoul (KR); Jung Hun Noh, Yongin-si (KR); Eun Kyung Yeon, Suwon-si (KR); Jae Been Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,809

(22) Filed: Apr. 10, 2023

(65) Prior Publication Data

US 2023/0260431 A1 Aug. 17, 2023

Related U.S. Application Data

(63) Continuation of application No. 17/126,210, filed on Dec. 18, 2020, now Pat. No. 11,636,785.

(30) Foreign Application Priority Data

Dec. 23, 2019 (KR) .................. 10-2019-0173004

(51) Int. Cl.
*G09F 9/30* (2006.01)
*H10K 71/00* (2023.01)
(Continued)

(52) U.S. Cl.
CPC ............ *G09F 9/301* (2013.01); *H10K 71/00* (2023.02); *H10K 77/111* (2023.02); *H10K 2102/311* (2023.02)

(58) Field of Classification Search
CPC ...... G09F 9/301; H10K 71/00; H10K 77/111; H10K 2102/311; G06F 2200/1612;
(Continued)

(56) References Cited

U.S. PATENT DOCUMENTS 11,636,785 B2 * 4/2023 Ahn ...................... G06F 1/1601
361/679.01

FOREIGN PATENT DOCUMENTS

KR 10-1443229 B1 9/2014
KR 10-1773443 B1 8/2017
(Continued)

*Primary Examiner* — J. E. Schoenholtz
(74) *Attorney, Agent, or Firm* — CANTOR COLBURN LLP

(57) ABSTRACT

A display device includes a flexible substrate including a folding area, a non-folding area adjacent to the folding area along a first direction, and a first surface in both the folding area and the non-folding area, a light-emitting element layer on the flexible substrate, and a support which faces the light-emitting layer with the flexible substrate therebetween, forms an interface with the first surface of the flexible substrate and is bendable together with the flexible substrate. The support includes a first support corresponding to the folding area, a second support corresponding to the non-folding area, and a through hole extended through the support. The through hole is extended through the first support, and a first portion of the first surface of the flexible substrate is exposed to outside the support by the through hole in the first support.

17 Claims, 27 Drawing Sheets

(51) Int. Cl.
*H10K 77/10* (2023.01)
*H10K 102/00* (2023.01)

(58) Field of Classification Search
CPC .... G06F 1/1601; G06F 1/1624; G06F 1/1641; G06F 1/1652; G06F 2203/04102; Y02E 10/549; Y02P 70/50; H01L 27/156
See application file for complete search history.

(56) References Cited

FOREIGN PATENT DOCUMENTS

| KR | 1020180121256 A | 11/2018 |
| KR | 1020190053691 A | 5/2019 |
| KR | 1020190081281 A | 7/2019 |

\* cited by examiner

DISPLAY DEVICE AND METHOD OF PROVIDING THE SAME

This application is a continuation application of U.S. patent application Ser. No. 17/126,210 filed on Dec. 18, 2020, which claims priority to Korean Patent Application No. 10-2019-0173004 filed on Dec. 23, 2019, and all the benefits accruing therefrom under 35 U.S.C. § 119, the disclosure of which is incorporated herein by reference in its entirety.

BACKGROUND

1. Field

The disclosure relates to a display device and a method of providing the same.

2. Description of the Related Art

Display devices are devices for displaying a video (e.g., moving image) or a still image. The display devices may be used as display screens for various kinds of electronic products such as televisions, notebook computers, monitors, digital signage and Internet of Things ("IoT") devices, as well as portable electronic devices such as mobile phones, smartphones, tablet personal computers ("PCs"), smart watches, watch phones, mobile communication terminals, electronic organizers, electronic books, portable multimedia players ("PMPs"), navigation devices and ultra-mobile PCs ("UMPCs").

Display devices having a larger display screen while providing a volume or thickness thereof smaller than or equal to that of a conventional electronic device is increasing. Foldable display devices which may be folded and unfolded, rollable display devices which may be rolled and unrolled, or the like so as to provide a larger display screen only at the time of use, are being developed.

SUMMARY

Embodiments provide a flexible display device with reduced pattern visibility.

Embodiments also provide a method of providing a flexible display device with reduced pattern visibility.

It should be noted that features of the invention are not limited to the above-described embodiments, and other features of the invention will be apparent to those skilled in the art from the following descriptions.

According to an embodiment, there is provided a display device including a flexible substrate including a folding area, a non-folding area adjacent to the folding area along a first direction, and a first surface in both the folding area and the non-folding area, a light-emitting element layer on the flexible substrate, and a support which faces the light-emitting layer with the flexible substrate therebetween, forms an interface with the first surface of the flexible substrate and is bendable together with the flexible substrate. The support includes a first support corresponding to the folding area, a second support corresponding to the non-folding area, and a through hole extended through the support. The through hole is extended through the first support, and a first portion of the first surface of the flexible substrate is exposed to outside the support by the through hole in the first support.

The folding area and the non-folding area may be repeatedly arranged along the first direction.

The second support may not include the through hole.

A planar shape of the through hole may be a line shape extending along a second direction which intersects the first direction.

The through hole may be plural in number, and the plurality of through holes may be arranged along the second direction to form a through hole group.

The through hole group may be plural in number, the plurality of through hole groups may include a first through hole group and a second through hole group which is adjacent to the first through hole group along the first direction, and the first through hole group and the second through hole group may be arranged in a staggered manner.

The through hole of the first through hole group may not overlap the through hole of the second through hole group along the first direction.

The first through hole group and the second through hole group may be repeatedly arranged along the first direction.

A center point may be defined in the through hole in a plan view, and a length from the center point to an end of the through hole along the first direction may be equal to a length from the center point to an end of the through hole along the second direction.

The through hole may have a planar shape including a first line portion extending along the first direction and a second line portion extending along the second direction, and the first line portion and the second line portion may intersect each other.

The first support may include an upper surface in contact with the flexible substrate and a lower surface which is opposite to the upper surface of the first support, and the through hole may be defined by the flexible substrate and the side surface of the first support.

A width of the through hole may decrease in a direction from the lower surface of the first support to the upper surface of the first support.

A slope of the side surface of the first support may increase in a direction from the lower surface of the first support to the upper surface of the first support.

A width of the through hole may be constant in a direction from the lower surface of the first support to the upper surface of the first support.

A width of the through hole may increase in a direction from the lower surface of the first support to the upper surface of the first support.

A surface of the flexible substrate exposed by the through hole may have a greater roughness than a surface of the flexible substrate which is adjacent to the through hole.

The display device may further include an etching solution residue in the through hole and in contact with the flexible substrate at the through hole.

According to an embodiment, a method of providing a display device includes providing a flexible substrate including a carrier substrate including a folding area at which the flexible substrate is bendable, a non-folding area which is adjacent to the folding area, and a first surface and a second surface which is opposite to the first surface, and a flexible material layer which is on the first surface of the carrier substrate and forms an interface therewith, providing a light-emitting element layer on the second surface of the flexible substrate, and providing a through hole in the carrier substrate which corresponds to the folding area. The providing of the through hole includes irradiating a laser to a location of the carrier substrate which is in the folding area to provide an irradiated location of the carrier substrate corresponding to the through hole, and etching the carrier substrate having the irradiated location.

The laser which is irradiated to the location of the carrier substrate to provide the irradiated location of the carrier substrate corresponding to the through hole includes a femtosecond laser.

The etching of the carrier substrate may include wet etching of both the irradiated location of the carrier substrate to provide the thorough hole extended through the thickness of the carrier substrate, and a location of the carrier substrate which is adjacent to the irradiated location thereof to reduce the thickness of the carrier substrate.

Other details of embodiments for solving the above problems are included in the detailed description and drawings.

BRIEF DESCRIPTION OF THE DRAWINGS

The above and other features of the invention will become more apparent by describing embodiments thereof in detail with reference to the attached drawings, in which.

DETAILED DESCRIPTION

Figure 1:
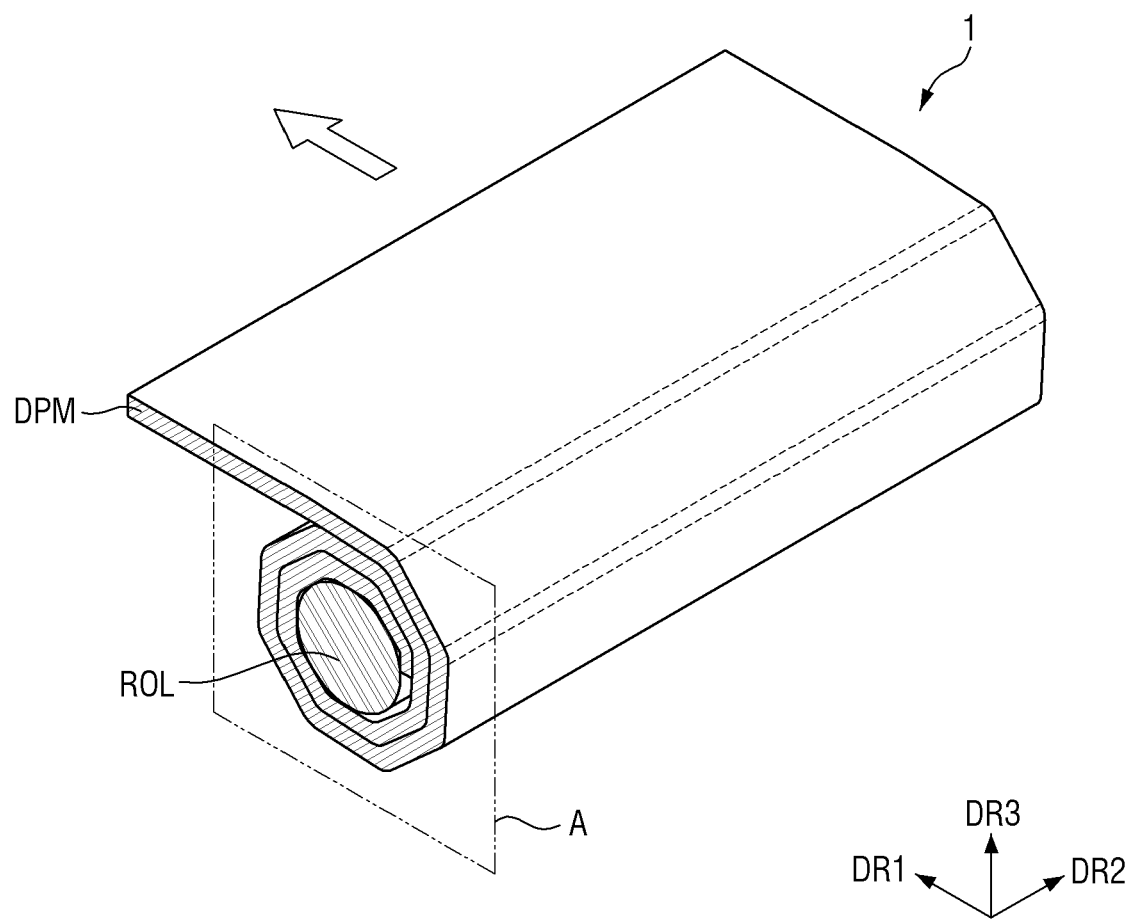
FIG. 1 is a perspective view of an embodiment of a display device which is bent.

Advantages and features of the invention and methods for accomplishing the same will be more clearly understood from embodiments described below with reference to the accompanying drawings. However, the invention is not limited to the following embodiments but may be implemented in various different forms. The embodiments are provided only to complete the invention and to fully provide a person having ordinary skill in the art to which the invention pertains with the category of the invention, and the invention will be defined by the appended claims. Throughout the specification, like reference numerals refer to like elements.

It will be understood that when an element or a layer is referred to as being related to another element such as being "on" or "above" another element or layer, it can be directly on or above another element or layer or intervening elements or layers may be present. In contrast, when an element or a layer is referred to as being related to another element such as being "directly on" or "directly above" another element or layer, no intervening elements or layers are present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 2:
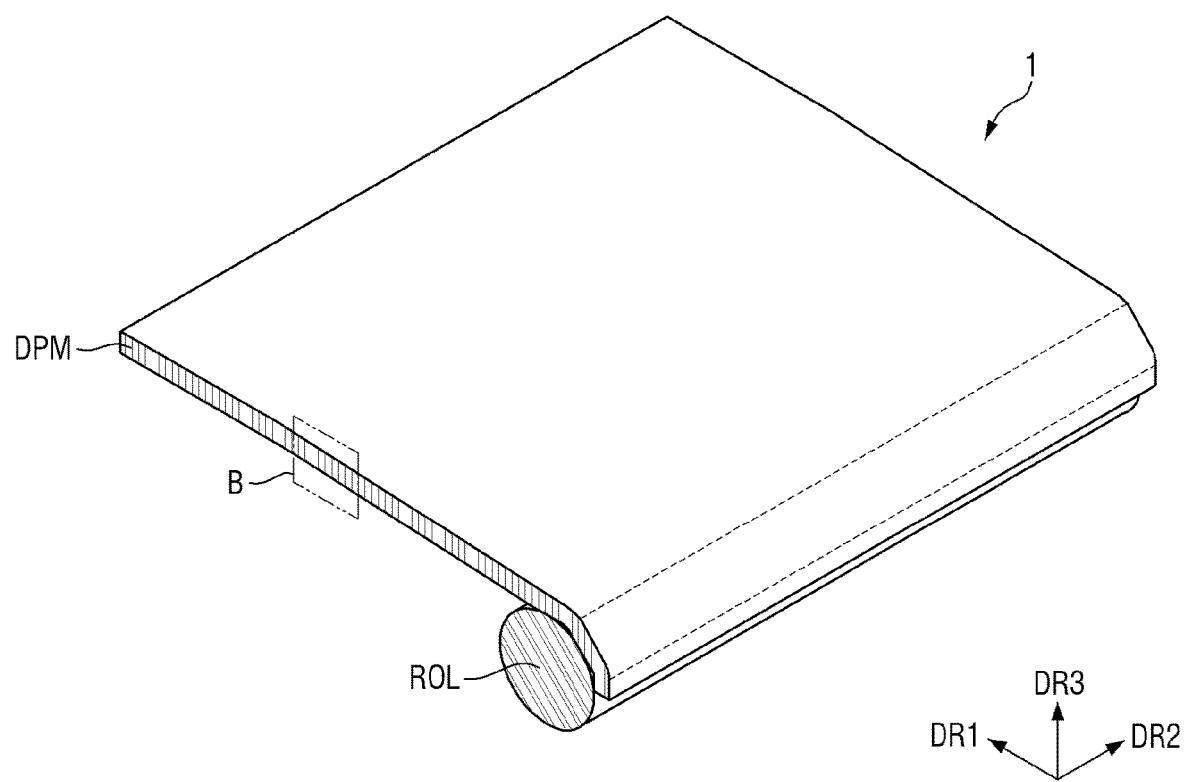
FIG. 2 is a perspective view of the display device which is unbent.
Figure 3:
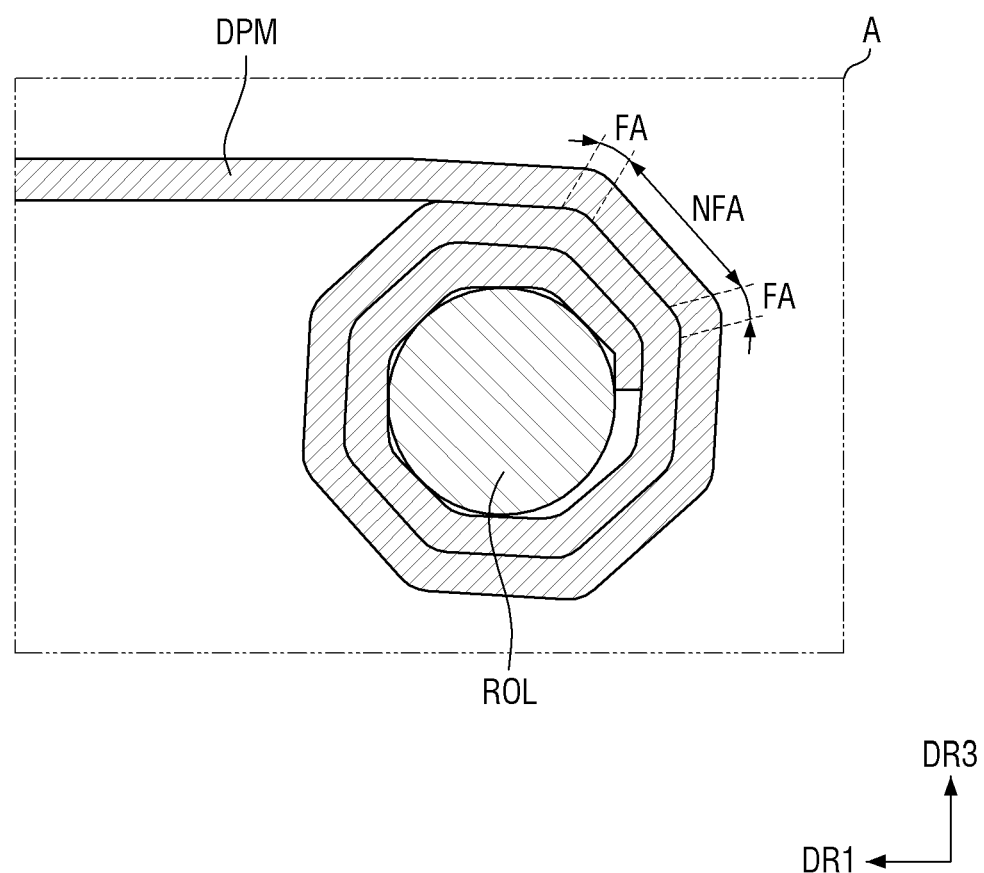
FIG. 3 is an enlarged cross-sectional view of area A of FIG. 1.
Figure 4:
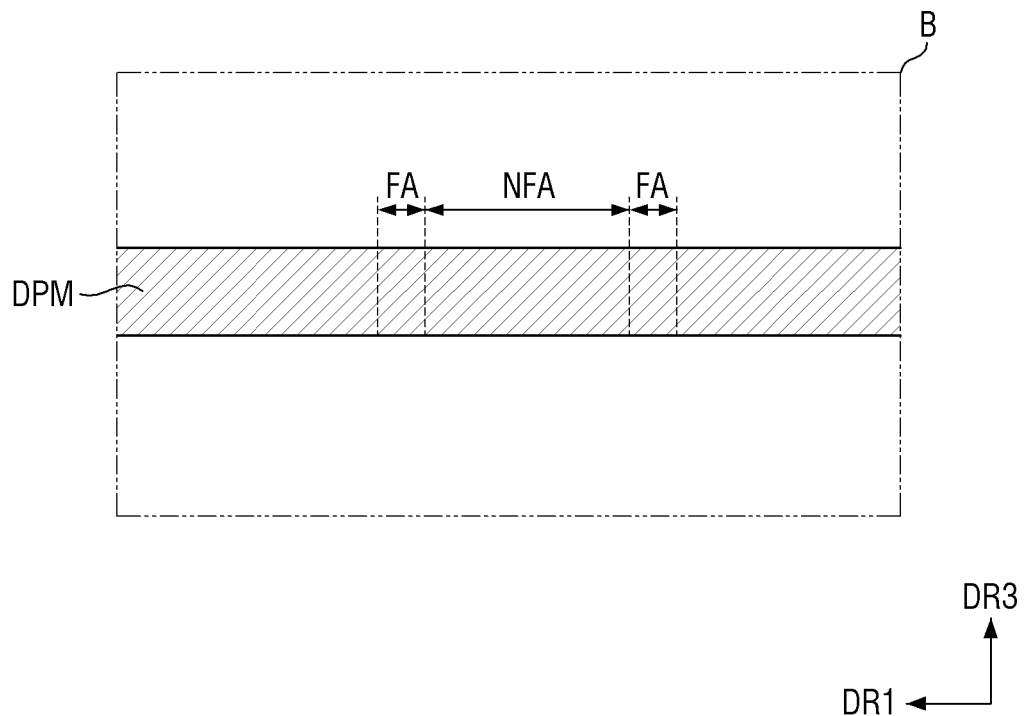
FIG. 4 is an enlarged cross-sectional view of area B of FIG. 2.
Figure 5:
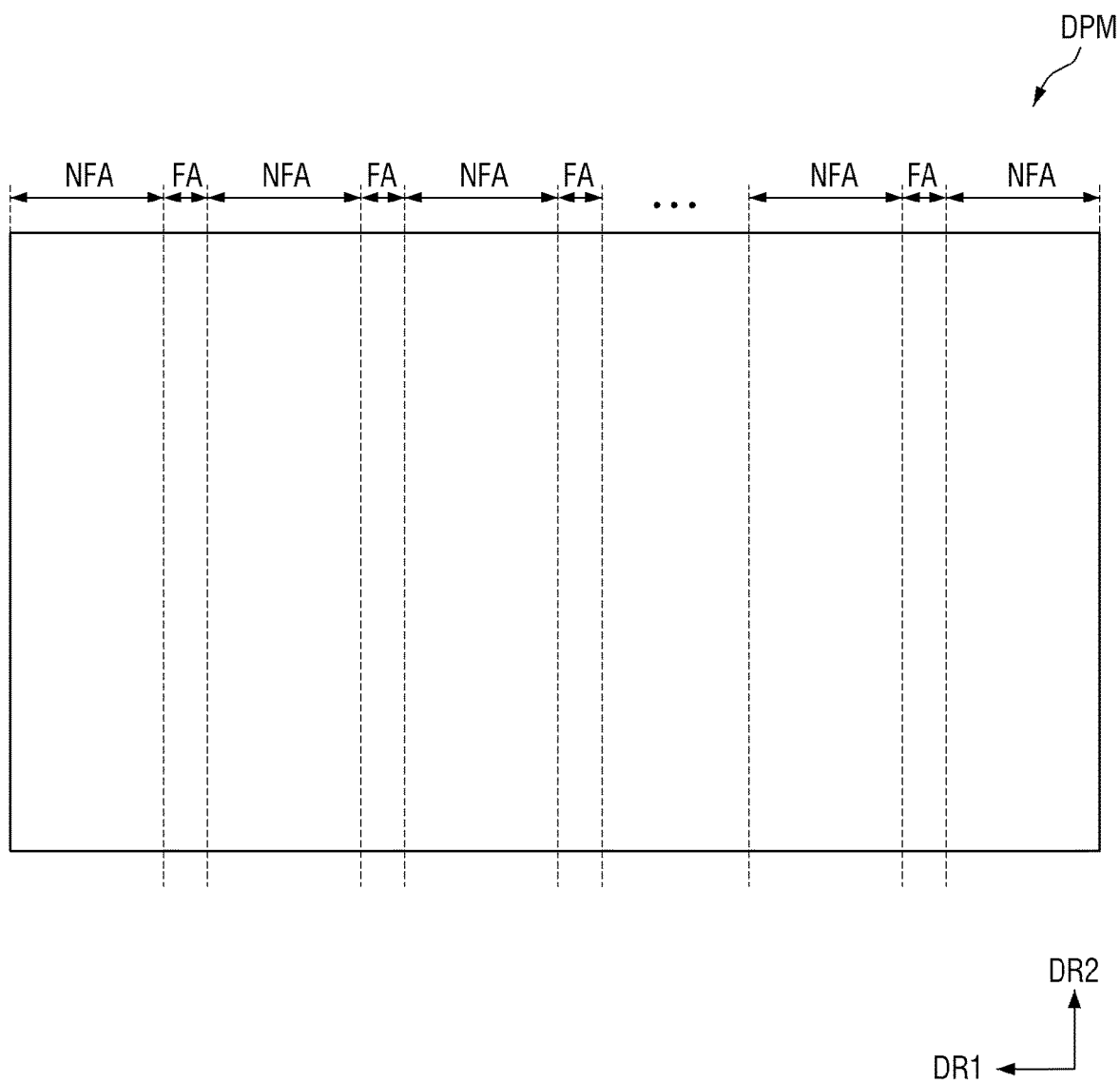
FIG. 5 is a plan view of an embodiment of a display module.

FIG. 1 is a perspective view of an embodiment of a display device 1 which is rolled to define a first operation state of the display device 1. FIG. 2 is a perspective view of the display device 1 which is unrolled to define a second operation state of the display device 1. FIG. 3 is an enlarged cross-sectional view of area A of FIG. 1. FIG. 4 is an enlarged cross-sectional view of area B of FIG. 2. FIG. 5 is a plan view of an embodiment of a display module DPM which is flat.

Referring to FIGS. 1 and 2, a display device 1 may be a flexible display device. As used herein, the term "flexible" may refer to being bendable, foldable, unfoldable, rollable, unrollable and the like. In an embodiment for example, the flexible display device may include a bendable display device, a foldable display device, a rollable display device, and the like. The display device 1 includes a display module DPM that defines or provides a display screen at which an image is displayed. The display module DPM may include or define a display panel, without being limited thereto. The bendable display device may refer to a display device 1 in which the display module DPM is maintained bent after the display device 1 is manufactured or provided regardless of the display device 1 being bent or unbent during operation thereof. Unlike the bendable display device, the foldable display device may refer to a display device 1 in which the display module DPM is foldable or unfoldable after the display device 1 is manufactured or provided. Like the foldable display device, the rollable display device may refer to a display device 1 in which the display module DPM is rollable or unfoldable after the display device 1 is manufactured or provided.

Hereinafter, after the display device 1 is manufactured, the display module DPM which is folded or rolled is referred to as being bent to define the first operation state, and the display module DPM which is unfolded or unrolled is referred to as being unbent to define the second operation state.

In an embodiment, the display device 1 which is rollable will be described, and a rollable display device is referred to as the display device 1 for convenience of description.

The display device 1 may include the display module DPM which generates and/or displays an image at a display screen, and a roller ROL along which the display module DPM extends. In an embodiment, the roller ROL may be surrounded by the display module DPM. The roller ROL may be rollable together with the display module DPM.

The display module DPM which is unrolled or flat may have a rectangular shape in a plan view. In an embodiment, for example, a planar shape of the display module DPM may be a rectangular shape defined by long sides extending along a first direction DR1 and short sides extending along a second direction DR2 crossing the first direction DR1. In an embodiment, for example, the planar shape of the display module DPM may be a rectangular shape with rounded corners at which long sides and short sides meet.

In the present specification, the first direction DR1 may refer to a direction along which the long sides (e.g., major dimension) of the display module DPM extend, and the second direction DR2 may refer to a direction along which the short sides (e.g., minor dimension) of the display module DPM extend. The first direction DR1 and the second direction DR2 may intersect each other. In an embodiment, for example, the first direction DR1 and the second direction DR2 may be orthogonal to each other. In the first direction DR1 may refer to a leftward direction in the perspective views of FIGS. 1 and 2, in a direction opposite to the first direction DR1 may refer to a rightward direction in the perspective views of FIGS. 1 and 2. In the second direction DR2 may refer to a front side direction in the perspective views of FIGS. 1 and 2, and in a direction opposite to the second direction DR2 may refer to a rear side direction in the perspective views of FIGS. 1 and 2.

A third direction DR3 may refer to a thickness direction of the display device 1 and various components thereof including the display module DPM. The third direction DR3 may intersect each of the first direction DR1 and the second direction DR2. In an embodiment, for example, in the third direction DR3 may refer to an upward direction in the perspective views of FIGS. 1 and 2, and in a direction opposite to the third direction DR3 may refer to a downward direction in the perspective views of FIGS. 1 and 2. However, it is to be understood that the described directions are intended to mean relative directions, and the present disclosure is not limited to the directions described in the embodiments.

In an embodiment, the planar shape of the display module DPM may be defined by the short sides extending along the first direction DR1 and the long sides extending along the second direction DR2.

In an embodiment, the planar shape of the display module DPM may include angled or rounded corners at which the long sides and the short sides respectively meet.

In an embodiment, the planar shape of the display module DPM may be a circular shape, an elliptical shape, a square shape, other polygonal shapes or the like.

As shown in FIGS. 1 and 2, a first end at a first short side of the display module DPM may be fixed to or by the roller ROL. The display module DPM which is rolled (e.g., in the first operation state) may be wrapped around an outer surface of the roller ROL to surround the roller ROL. The roller ROL and/or the display module DPM may rotate to be rolled in the direction opposite to the first direction DR1, and may rotate to be rolled in the first direction DR1. The roller ROL may define or include an axis about which the roller ROL and/or the display module DPM is rollable. Referring to FIGS. 1, 2 and 3, the axis may extend along the second direction DR2.

The roller ROL may have a circular column three-dimensional shape. A cross-sectional shape of the roller ROL of a plane defined by the first direction DR1 and the third direction DR3 may be a circular shape. The roller ROL may have a length (e.g., major dimension) extending along the second direction DR2. The roller ROL may have a first end and a second end which oppose each other along the second direction DR2. An extending length of the roller ROL, for example, an extending length from the first end of the roller ROL in the second direction DR2 to the second end thereof in the second direction DR2 may be equal to an extending length of the display module DPM which extends from a first long side in the second direction DR2 to a second long side in the second direction DR2, but the invention is not limited thereto. That is, a dimension of the roller ROL and a dimension of the display module DPM along the second direction DR2 may be the same as each other.

In FIGS. 1 and 2, it is illustrated that an entirety of the long sides of the display module DPM are curved along an outer circumference of the roller ROL (for example, all portions defining or forming the long sides have curvature) in the plane defined by the first direction DR1 and the third direction DR3. However, in more detail, as shown in FIG. 3, the long sides of the display module DPM may each have curved portions having a predetermined curvature along the outer circumference of the roller ROL and flat portions without a curvature along the outer circumference of the roller ROL, which are sequentially arranged. The long sides of the display module DPM, each of which has a structure in which the curved portions and the flat portions are alternated along the outer circumference of the roller ROL, may surround the roller ROL.

Among portions of the display module DPM, a curved portion having the curvature defines a folding area FA and a flat portion without the curvature defines a non-folding area NFA. The non-folding area NFA may remain flat or without curvature even in the display module DPM which is rolled. The curved portion may be provided from a curvable portion of the display module DPM while the flat portion may be provided from a non-curvable portion of the display module DPM which is not curvable or merely remains flat or without curvature even in the display module DPM which is rolled. Hereinafter, the curved portion of the display module DPM having a predetermined curvature may be provided in plural including folding areas FA, and the flat portion of the display module DPM without a curvature may be provided in plural including non-folding areas NFA.

Movement of the second end of the display module DPM in the first direction DR1 while the first end of the display module DPM is fixed by the roller ROL (indicated by arrow in FIG. 1), unrolls or unfolds the display module DPM (FIG. 2). In FIGS. 1 and 2, a rolling direction along which the display device 1 is rolled about the roller ROL may be defined along the first direction DR1.

When the display device 1 is rolled and unrolled, the short sides of the display module DPM may not be rolled along an outer surface of the roller ROL and may remain in an unfolded state or flat state corresponding to a profile of the roller ROL along the second direction DR2. In contrast, the long sides of the display module DPM may be rolled or unfolded along the cross-sectional shape of the roller ROL in the plane defined by the first direction DR1 and the third direction DR3.

In the display device 1, which is unrolled or unfolded, the folding area FA of the display module DPM may not have a predetermined curvature (e.g., flat) as shown in FIG. 4. In detail, the display device 1 which is unrolled disposes the folding area FA and the non-folding area NFA coplanar with each other (e.g., flat).

As shown in FIG. 5, the folding areas FA and the non-folding areas NFA may be defined in the display module DPM. The non-folding areas NFA may be located around the folding area FA, such as at opposing sides of a folding area FA. A major dimension (e.g., length) of the folding area FA and the non-folding area NFA may cross or intersect both a first long side of the display module DPM in the second direction DR2 and a second long side of the display module DPM in the second direction DR2. A planar shape of each of the folding area FA and the non-folding area NFA may be a rectangular shape. The folding area FA and the non-folding area NFA which is adjacent to the folding area FA may share or form a boundary with each other and may be in contact with each other. As being in contact, the folding area FA and the non-folding area NFA may form an interface with each other at the boundary. The folding area FA and the non-folding area NFA may be defined by an entire dimension of the display module DPM along the second direction DR2, and a respective dimension along the first direction DR1, without being limited thereto.

According to an embodiment, a plurality of folding areas FA and a plurality of non-folding areas NFA may be provided along the first direction DR1. The folding areas FA and the non-folding areas NFA may be sequentially and repeatedly arranged in the first direction DR1.

In order for the display module DPM to be switched between the operation states, a base substrate including a flexible material and having a small thickness may be applied. A circuit layer, a display element layer, a polarizer layer, a film layer, and the like may be stacked on the base substrate of the display module DPM, to which the flexible material is applied, which will be described below. When the base substrate includes a flexible material and has a small thickness, the flatness of the display module DPM itself may be reduced.

A support FST may be further disposed on a lower portion of the base substrate to maintain the flatness of the display module DPM. The support FST may have a thickness which is greater than the thickness of the base substrate and include a rigid material such as glass or quartz and thus maintain the flatness of the display module DPM. A rigidity of the support FST may be greater than a rigidity of the base substrate. In order to increase the flatness of the display module DPM, the support FST may have a thickness greater than that of the base substrate and may include a rigid material. Additionally, a planar area of a portion of the support FST which overlaps or corresponds to the base substrate may be larger to increase the flatness of the display module DPM.

However, as described above, in order for the display module DPM to be rolled, the flexibility of the support FST disposed at the lower portion of the base substrate should be secured. In particular, the flexibility of the support FST is required in the folding area FA at which the display module DPM is curvable and uncurvable while switching between the operation states.

In order to simultaneously satisfy the flatness increasing characteristics and flexibility characteristics of the display module DPM including the support FST, the planar area and planar shape of the support FST at portions thereof corresponding to the folding area FA are adjusted.

Figure 6:
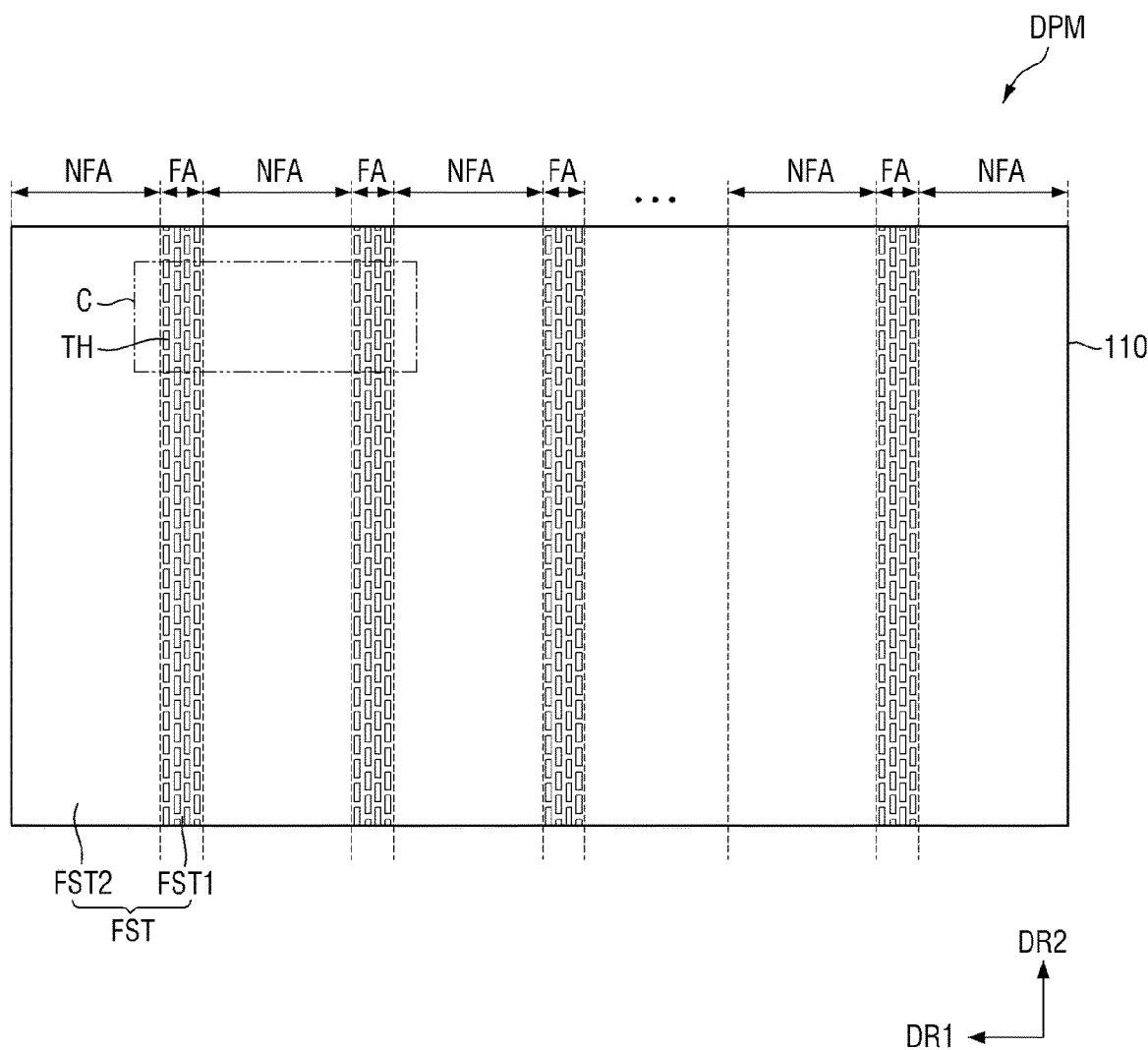
FIG. 6 is a plan view of an embodiment of a flexible substrate and a support.
Figure 7:
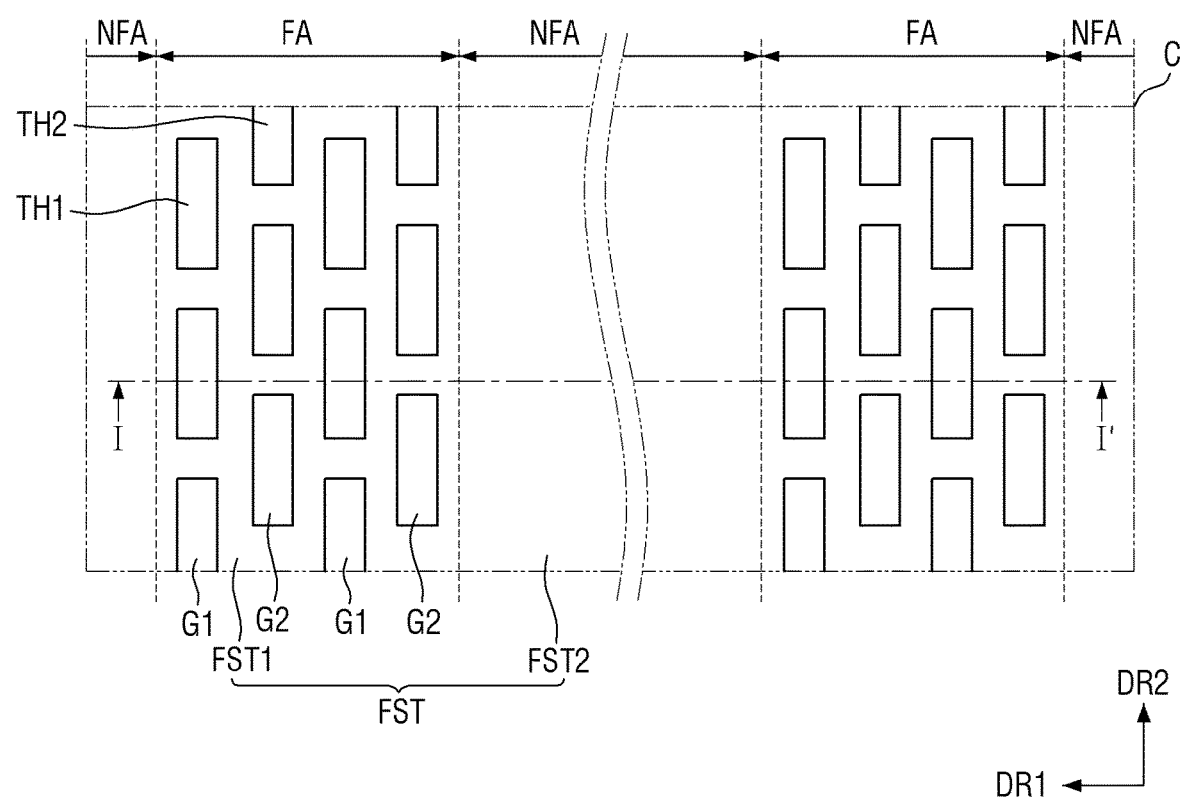
FIG. 7 is an enlarged plan view of area C of FIG. 6.
Figure 8:
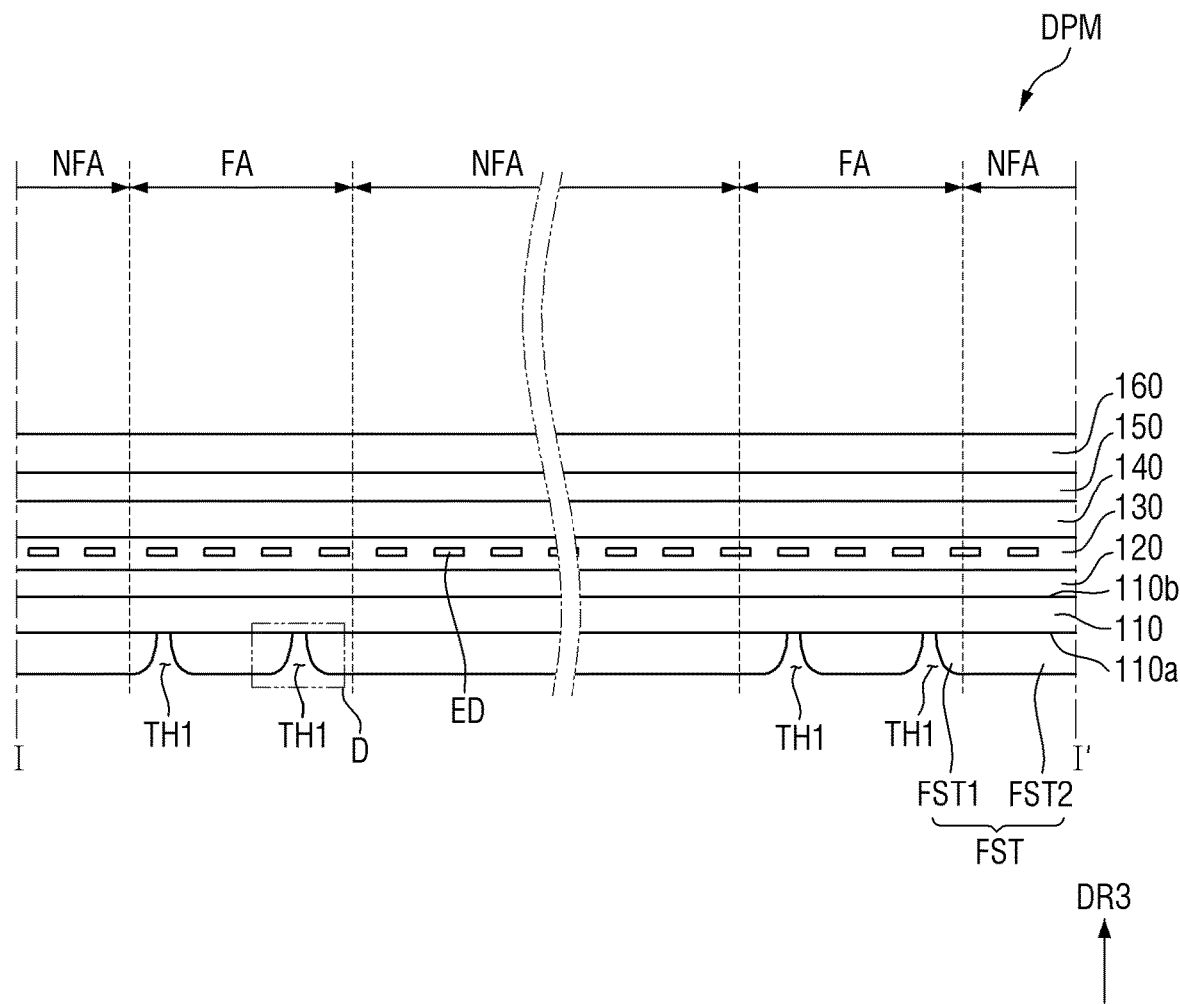
FIG. 8 is an enlarged cross-sectional view taken along line I-I' of FIG. 7.
Figure 9:
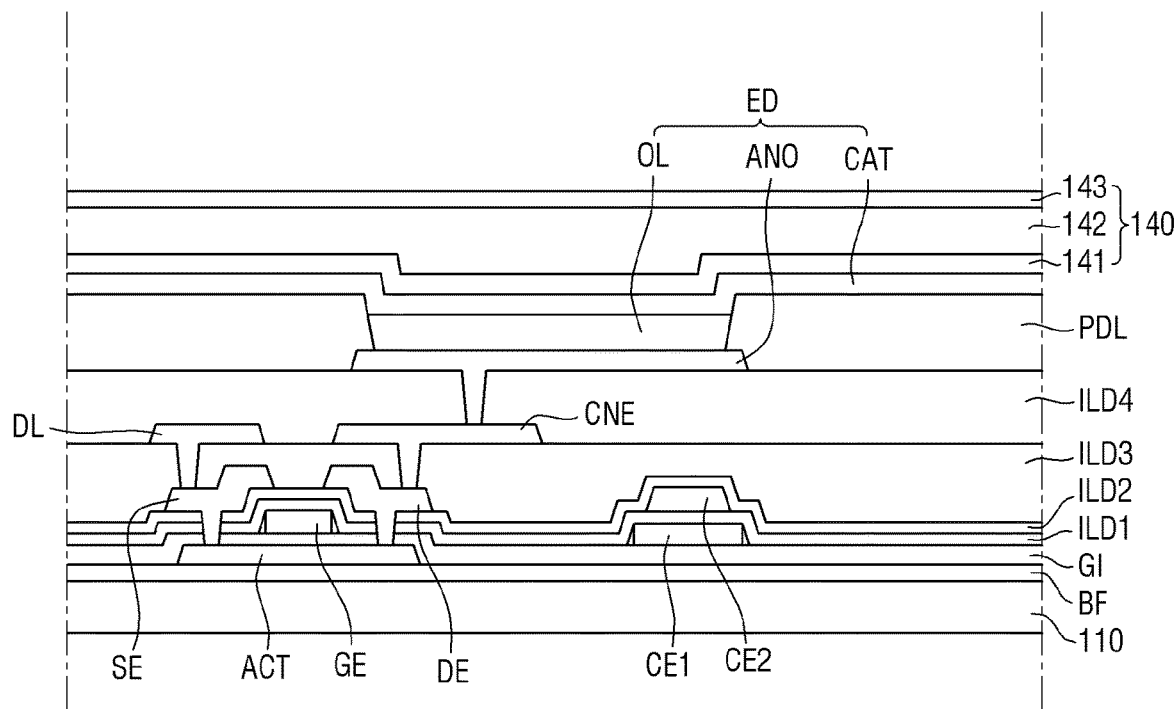
FIG. 9 is an enlarged cross-sectional view illustrating the flexible substrate and an upper structure of the flexible substrate of FIG. 8.
Figure 10:
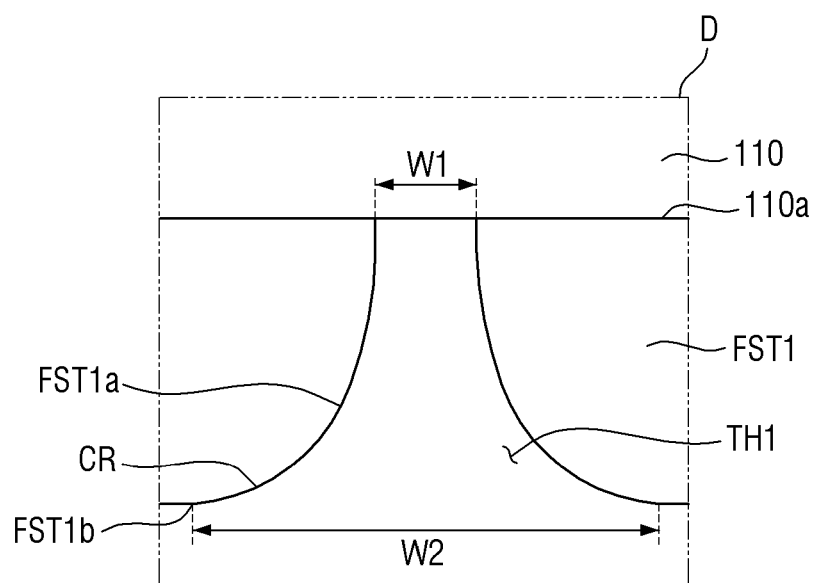
FIG. 10 is an enlarged cross-sectional view of area D of FIG. 8.

FIG. 6 is a plan view of an embodiment of a flexible substrate 110 and a support FST. FIG. 7 is an enlarged plan view of area C of FIG. 6. FIG. 8 is an enlarged cross-sectional view taken along line I-I' of FIG. 7. FIG. 9 is an enlarged cross-sectional view illustrating the flexible substrate 110 and an upper structure of the flexible substrate 110 of FIG. 8. FIG. 10 is an enlarged cross-sectional view of area D of FIG. 8.

Referring to FIG. 6, the display module DPM may include a flexible substrate 110 and a support FST. The support FST may be disposed to overlap or correspond to the flexible substrate 110. A planar shape of the support FST may be identical to or similar to a planar shape of the flexible substrate 110. In an embodiment, for example, the planar shape of the support FST may be a rectangular shape which includes long sides extending along the first direction DR1 and short sides extending along the second direction DR2.

The support FST may include a first support FST1 (e.g., first support portion) disposed in the folding area FA, and a second support FST2 (e.g., second support portion) disposed in the non-folding area NFA. The first support FST1 may have a planar shape identical to or similar to that of the folding area FA and may have a planar area identical to or similar to that of the folding area FA. The second support FST2 may have a planar shape identical to or similar to that of the non-folding area NFA and may have a planar area identical to or similar to that of the non-folding area NFA.

Like the folding area FA and the non-folding area NFA are sequentially and repeatedly arranged along the first direction DR1, the supports FST1 and FST2 may be sequentially and repeatedly arranged along the first direction DR1.

The first support FST1 may include through holes TH. On the other hand, the second support FST2 may not include the through holes TH. That is, the second support FST2 excludes a through hole TH and may include only a solid portion extending from the folding area FA. A through hole TH is extended through the support FST, such as through the first support FST1. The through hole TH is excluded from the second support FST2.

Referring to FIG. 7, a through hole TH or recess may be provided in plurality including a plurality of through holes TH. The plurality of through holes TH may include a first through hole TH1 provided in plurality including first through holes TH1 and a second through hole TH2 provided in plurality including second through holes TH2. A planar shape of each of the through holes TH1 and TH2 may have a line shape extending along the second direction DR2. A planar shape of each of the first through holes TH1 and the second through holes TH2 may be a rectangular shape. However, the planar shape of each of the first through holes TH1 and the second through holes TH2 is not limited thereto and may be an elliptical shape or other polygonal shapes extending along the second direction DR2.

In an embodiment, for example, the first through hole TH1 and the second through hole TH2 may have the same planar shape. In an embodiment, for example, the first through hole TH1 and the second through hole TH2 may have the same planar area.

When a rectangular shape is applied as the planar shape of each the through holes TH1 and TH2, the through holes TH1 and TH2 may each include short sides extending along the first direction DR1 and long sides extending along the second direction DR2.

In an embodiment, for example, a short side length of each of the through holes TH1 and TH2 may be less than or equal to about 200 micrometers (pa), and a long side length of each of the through holes TH1 and TH2 may be less than or equal to about 500 μm.

A plurality of first through holes TH1 and a plurality of second through holes TH2 may be provided. The plurality of through holes TH1 and TH2 may be arranged along the second direction DR2 to form a through hole group. The plurality of first through holes TH1 arranged along the second direction DR2 form a first group G1 (e.g., first through hole group), and the plurality of second through holes TH2 arranged in the second direction DR2 form a second group G2 (e.g., second through hole group). The through holes TH1 and TH2 of the groups G1 and G2 may be arranged to be spaced apart from each other along the second direction DR2. The first group G1 and the second group G2 may be disposed adjacent to each other along the first direction DR1.

The plurality of first through holes TH1 of the first group G1 and the plurality of second through holes TH2 of the second group G2 may be arranged in a staggered manner. In an embodiment, for example, a separation space (e.g., first separation space) between the first through holes TH1 within the first group G1 which are adjacent to each other along the second direction DR2, may be aligned with the second through hole TH2 of the second group G2 which is adjacent to the separation space along the first direction DR1, along the first direction DR1. Also, a separation space (e.g., second separation space) between the second through holes TH2 within the second group G2 which are adjacent to each other along the second direction DR2 may be aligned with the first through hole TH1 of the first group G1 which is adjacent to the separation space along the first direction DR1, along the first direction DR1.

Short sides of different through holes among the first through holes TH1 within the first group G1 face each other along the second direction DR2 with the first separation space therebetween, and the short sides may each be aligned with the second through hole TH2 of the second group G2 which is adjacent to the short sides along the first direction DR1. Also, short sides of different through holes among the second through holes TH2 within the second group G2 face each other along the second direction DR2 with the second separation space therebetween, and the short sides may each be aligned with the first through hole TH1 of the first group G1 which is adjacent to the short sides along the first direction DR1.

A plurality of first groups G1 and a plurality of second groups G2 may be provided. In FIG. 7, it is illustrated that two of the first groups G1 and two of the second groups G2 are provided within a folding area FA, but is not limited thereto. In an embodiment, one of the first group G1 and one of the second group G2 may be provided within the folding area FA, or three or more of the first groups G1 and three or more of the second groups G2 may be provided within the folding area FA.

Within a folding area FA, the first groups G1 and the second groups G2 may be sequentially and repeatedly arranged along the first direction DR1.

Each of the through holes TH1 and TH2 may be surrounded or defined by a material of the support FST in a plan view. In an embodiment, for example, each of the through holes TH1 and TH2 may be completely surrounded by the material of the support FST in a plan view. The through holes may be considered as an enclosed opening of the support FST.

Referring to FIG. 8, the display module DPM may include the flexible substrate 110, a circuit driving layer 120 formed or provided on the flexible substrate 110, a light-emitting element layer 130 formed on the circuit driving layer 120, a thin-film encapsulation layer 140 (e.g., encapsulation layer) formed or provided on the light-emitting element layer 130, a polarizing layer 150 formed or provided on the thin-film encapsulation layer 140, a protective layer 160 formed or provided on the polarizing layer 150, and the support FST formed or provided on the lower portion of the flexible substrate 110.

The flexible substrate 110 may include or be made of an insulating material such as a flexible polymer resin. Examples of the polymer resin may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. In an embodiment, the flexible substrate 110 may include polyimide ("PI"), but is not limited thereto.

The flexible substrate 110 may have a small thickness in order for the display module DPM to be rolled and unrolled. However, as described above, when the flexible substrate 110 includes a flexible material and has a small thickness, the flatness of the display module DPM may be reduced.

The circuit driving layer 120 may include a circuit for driving the light-emitting element layer 130 of a pixel within the display module DPM. The circuit driving layer 120 may include a plurality of thin-film transistors. The circuit driving layer 120 may be connected to the light-emitting element layer 130.

The light-emitting element layer 130 may be disposed on the circuit driving layer 120. The light-emitting element layer 130 may include a light-emitting element ED provided in plural including a plurality of light-emitting elements ED. Each of the light-emitting elements ED may include an organic light-emitting layer or an inorganic light-emitting layer. The light-emitting element layer 130 may generate and/or emit light with various levels of luminance according to a driving signal transmitted from the circuit driving layer 120. The light-emitting element ED may be a display element, without being limited thereto.

In an embodiment, for example, the light-emitting element ED may include a self-emissive element. The self-emissive element may include at least one of an organic light-emitting diode ("OLED"), a quantum dot LED, or an inorganic material-based micro LED (for example, a micro LED), and an inorganic material-based nano LED (for example, a nano LED).

The thin-film encapsulation layer 140 may be disposed on the light-emitting element layer 130. The thin-film encapsulation layer 140 may include an inorganic film or a stacked structure of an inorganic film and an organic film. In an embodiment, an encapsulation film or the like may be applied as the thin-film encapsulation layer 140.

The polarizing layer 150 may be disposed on the thin-film encapsulation layer 140. The polarizing layer 150 may serve to reduce the reflection of external light. The polarizing layer 150 may be attached to a member therebelow through an adhesive layer. The polarizing layer 150 may be omitted. In an embodiment in which the polarizing layer 150 is omitted, a color filter layer may be disposed on the thin-film encapsulation layer 140.

The protective layer 160 may be disposed on the polarizing layer 150. The protective layer 160 may include, for example, a window member. The protective layer 160 may be attached onto the polarizing layer 150 through an optically transparent adhesive or the like.

Although not shown in the drawings, a touch layer (e.g., input sensing layer) may be disposed between the thin-film encapsulation layer 140 and the polarizing layer 150. The touch layer is a layer that recognizes a touch input and may perform the function of a touch member. The touch layer may include a plurality of sensing areas and sensing electrodes. The touch layer may be disposed directly on the thin-film encapsulation layer 140 but is not limited thereto and may be attached onto the thin-film encapsulation layer 140 in the form of a panel.

The support FST may be disposed at the lower portion of the flexible substrate 110.

The flexible substrate 110 may include a first surface 110a facing the support FST and a second surface 110b that is a surface opposite to the first surface 110a. The second surface 110b of the flexible substrate 110 may face the circuit driving layer 120. The support FST faces the light-emitting element layer 130 with the flexible substrate 110 therebetween, forms an interface with the first surface 110a of the flexible substrate 110 and is bendable together with the flexible substrate 110.

The support FST may be disposed directly on the second surface 110b of the flexible substrate 110 and may be in direct contact with the second surface 110b of the flexible substrate 110. As being in direct contact, for example, no material may be interposed between the support FST and the second surface 110b of the flexible substrate 110. The support FST and flexible substrate 110 may form an interface therebetween.

FIG. 9 illustrates an embodiment of the upper structure of the flexible substrate 110 in more detail.

Referring to FIG. 9, a buffer layer BF may be disposed on the flexible substrate 110. The buffer layer BF may include or be formed of a plurality of stacked layers. The buffer layer BF may serve to protect the thin-film transistors and the light-emitting element ED from moisture and impurities (F and C-H) that penetrate through the flexible substrate 110.

The buffer layer BF may include or be formed of at least one inorganic film among a silicon oxide film, a silicon nitride film and a silicon oxynitride layer, a titanium oxide film, and an aluminum oxide film.

The buffer layer BF may be a single film including or made of a material selected from among the above-exemplified materials or may be a multi-layer film made of materials selected from among the above-exemplified materials.

A semiconductor layer ACT of the thin-film transistor may be disposed on the buffer layer BF. The semiconductor layer ACT may include an oxide semiconductor or polycrystalline silicon.

A gate insulating film GI may be disposed on the semiconductor layer ACT. The gate insulating film GI may include an inorganic material. In an embodiment, for example, the gate insulating film GI may include or be formed of at least one inorganic film among a silicon oxide film, a silicon nitride film and a silicon oxynitride layer, a titanium oxide film, and an aluminum oxide film. The gate insulating film GI is illustrated as being disposed over the whole surface of the flexible substrate 110 in FIG. 9 but is not limited thereto and may be disposed only in a planar area between the semiconductor layer ACT and a gate electrode GE to be described below.

The gate electrode GE of the thin-film transistor and a first electrode CE1 of a capacitor may be disposed on the gate insulating film GI.

The gate electrode GE may include or be formed as a single layer or a multi-layer made of one selected from among molybdenum (Mo), aluminum (Al), chromium (Cr), gold (Au), titanium (Ti), nickel (Ni), neodymium (Nd), and copper (Cu) and an alloy thereof.

The first electrode CE1 may include at least one among the above-exemplified materials of the gate electrode GE. The first electrode CE1 and the gate electrode GE may include the same material and may be provided or formed through the same process. In an embodiment, the first electrode CE1 and the gate electrode GE may be respective portions of a same material layer to be in a same layer as each other.

A first insulating film ILD1 (e.g., first insulating layer) may be disposed on the gate electrode GE. The first insulating film ILD1 may include a glass insulating material or an inorganic insulating material.

A second electrode CE2 of the capacitor may be disposed on the first insulating film ILD1. The second electrode CE2 may be disposed to overlap the first electrode CE1 along the thickness direction. The second electrode CE2 may form the capacitor together with the first electrode CE1 using the first insulating film ILD1 as a dielectric.

A second insulating film ILD2 (e.g., second insulating layer) may be disposed on the second electrode CE2. The second insulating film ILD2 may include a glass insulating material or an inorganic insulating material.

A source electrode SE and a drain electrode DE of the thin-film transistor may be disposed on the second insulating film ILD2. The source electrode SE may be electrically connected to a source area of the semiconductor layer ACT through contact holes passing through the gate insulating film GI and the insulating films ILD1 and ILD2, and the drain electrode DE may be electrically connected to a drain area of the semiconductor layer ACT through contact holes passing through the gate insulating film GI and the insulating films ILD1 and ILD2. The source electrode SE and the drain electrode DE may each be provided or formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof.

A third insulating film ILD3 (e.g., third insulating layer) may be disposed on the source electrode SE and the drain electrode DE. The third insulating film ILD3 may include a glass insulating material or an inorganic insulating material. The third insulating film ILD3 may be a protective film protecting the source electrode SE and the drain electrode DE.

A data line DL and a connection electrode CNE may be disposed on the third insulating film ILD3. The data line DL may be electrically connected to the source electrode SE through a respective contact hole passing through the third insulating film ILD3, and the connection electrode CNE may be electrically connected to the drain electrode DE through a respective contact hole passing through the third insulating film ILD3.

The data line DL and the connection electrode CNE may each include or be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. The data line DL and the connection electrode CNE may be in a same layer as each other.

A fourth insulating film ILD4 (e.g., fourth insulating layer) may be disposed on the data line DL and the connection electrode CNE. The fourth insulating film ILD4 may include a glass insulating material or an inorganic insulating material. The fourth insulating film ILD4 may be a protective film protecting the data line DL and the connection electrode CNE. In an embodiment, the fourth insulating film ILD4 may be a planarization film or planarizing layer.

The fourth insulating film ILD4 may include an acryl resin, an epoxy resin, a phenolic resin, a polyamide resin, a polyimide resin, or the like.

A third electrode ANO of the light-emitting element ED and a pixel defining film PDL (e.g., pixel defining layer) may be disposed on the fourth insulating film ILD4. The third electrode ANO may be a pixel electrode. The third electrode ANO may be an anode of the light-emitting element ED. The third electrode ANO may be electrically connected to the drain electrode DE through a respective contact hole passing through the fourth insulating film ILD4. In a top emission structure in which light is emitted in the direction of a fourth electrode CAT with respect to a light-emitting layer OL, the third electrode ANO may include be made of a metal material having high reflectivity. In an embodiment, for example, the third electrode ANO may have a stacked structure (Ti/Al/Ti) of aluminum and titanium, a stacked structure (ITO/Al/ITO) of aluminum and indium tin oxide ("ITO"), a silver-palladium-copper ("APC") alloy, and a stacked structure (ITO/APC/ITO) of an APC alloy and ITO. The APC alloy is an alloy of silver (Ag), palladium (Pd), and copper (Cu). Alternatively, the third electrode ANO may include be formed of a single layer made of molybdenum (Mo), titanium (Ti), copper (Cu), or aluminum (Al).

The pixel defining film PDL may cover an edge of the third electrode ANO and expose a central portion thereof. The pixel defining film PDL may include be formed of an organic film made of an acrylic resin, an epoxy resin, a phenolic resin, a polyamide resin, a polyimide resin, or the like. In an embodiment, the pixel defining film PDL may include an inorganic material.

The light-emitting layer OL is provided or formed on the third electrode ANO and the pixel defining film PDL. The light-emitting layer OL may include an organic material to emit a certain color. In an embodiment, for example, the light-emitting layer OL may include a hole transporting layer, an organic material layer and an electron transporting layer.

In an embodiment, the light-emitting layer OL may include an inorganic material or a quantum dot material.

The fourth electrode CAT is provided or formed on the light-emitting layer OL. The fourth electrode CAT may be provided or formed to cover the light-emitting layer OL. The fourth electrode CAT may be a common electrode. The fourth electrode CAT may be a cathode of the light-emitting element ED.

In the top emission structure, the fourth electrode CAT may include a transparent conductive material capable of transmitting light, such as ITO or IZO, or may include a semi-transmissive conductive material.

The thin-film encapsulation layer 140 may be provided or formed on the fourth electrode CAT. The thin-film encapsulation layer 140 may include at least one inorganic film to prevent oxygen or moisture from penetrating into the light-emitting layer OL. In addition, the thin-film encapsulation layer 140 may include at least one organic film to protect the light-emitting layer OL from foreign substances such as dust. In an embodiment, for example, the thin-film encapsulation layer 140 may include a first inorganic encapsulation film 141 (e.g., first inorganic layer) provided or formed on the fourth electrode CAT, an organic encapsulation film 142 (e.g., organic layer) provided or formed on the first inorganic encapsulation film 141, and a second inorganic encapsulation film 143 (e.g., second inorganic layer) provide or formed on the organic encapsulation film 142.

As described above, a thickness of the support FST is greater than at thickness of the flexible substrate 110 and includes a rigid material such as glass or quartz to allow the flatness of the display module DPM to be maintained.

However, as described above, in order for the display module DPM to be rollable, the flexibility of the support FST disposed directly on the lower portion of the flexible substrate 110 should be secured. In particular, the flexibility of the support FST is provided at the folding area FA at which the display device 1 is curvable and uncurvable.

That is, in order to simultaneously satisfy the flatness increasing characteristics and flexibility characteristics of the display module DPM of the support FST, a shape of the first support FST1 disposed in the folding area FA and a shape of the second support FST2 disposed in the non-folding area NFA may be different from each other, and an overlapping planar area between the first support FST1 and the flexible substrate 110 and an overlapping planar area between the second support FST2 and the flexible substrate 110 may be different from each other.

In order to secure the flexibility of the display module DPM at the folding area FA, the smaller the planar area of a material of the first support FST1 disposed in the folding area FA, the more advantageous it may be. When the planar area of the material of the first support FST1 of the folding area FA is reduced, such as by removing material portions of the first support FST1 along the second direction DR2 which is the direction along which the folding area FA extends, it may be advantageous in terms of securing the flexibility. However, a step difference between the recesses from which material of the first support FST1 is removed and the second support FST2 may be recognized as a pattern.

However, in one or more embodiment of the display module DPM, in order to secure the flexibility in the folding area FA, the plurality of through holes TH are provided or formed in the first support FST1, and the extending direction of each of the through holes TH and the arrangement direction of the plurality of through holes TH (that is, the extending direction of the first group G1 and the second group G2) may be provided to intersect or to be orthogonal to the first direction DR1 which is the direction in which the display module DPM is rollable (e.g., rolling direction). In addition, the short side length of each of the through holes TH1 and TH2 may be less than or equal to about 200 and the long side length of each of the through holes TH1 and TH2 may be designed to be less than or equal to about 500 μm so that visibility of the through holes TH1 and TH2 from outside the display module DPM may be greatly reduced.

Referring to FIG. 10, the first support FST1 may include an upper surface in contact with the first surface 110a of the flexible substrate 110, a lower surface FST1b that is a surface opposite to the upper surface of the first support FST1, and inner side surfaces FST1a connecting the upper surface and the lower surface FST1b of the first support FST1 to each other. The lower surface FST1b may be furthest from the flexible substrate 110.

The first through hole TH1 may be defined by an extension line (e.g., virtual extension) of the upper surface of the first support FST1, an extension line of the lower surface FST1b of the first support FST1, and the inner side surfaces FST1a. The extension line of the upper surface of the first support FST1 (e.g. first extension line) may meet each of upper surfaces of first supports FST1 which are adjacent to each other (e.g., be coplanar with each other). The extension line of the lower surface FST1b of the first support FST1 (e.g., second extension line) may meet lower surfaces FST1b of first supports FST1 which are adjacent to each other. At a same one of the first through hole TH1, each of the inner side surfaces FST1a of the first support FST1 may connect a point at which the extension line of the lower surface FST1b of the first support FST1 meets the lower surface FST1b and a point at which the extension line of the upper surface of the first support FST1 meets the upper surface of the first support FST1. The first extension line may be defined at a portion of the first surface 110a which is exposed to outside the support FST by the first through hole TH1. An extension line which meets or extends from a respective surface may be coplanar with such surface.

A width (e.g., minor dimension) of the through holes TH may be defined along the rolling direction (e.g., first direction DR1) In cross-section, a width of the first through hole TH1 may decrease in a direction toward the upper surface of the first support FST1 from the lower surface FST1b of the first support FST1. The width of the first through hole TH1 may include a first width W1 (e.g., upper width), which is equal to a length of the extension line of the upper surface of the first support FST1, and a second width W2 (e.g., lower width) that is equal to a length of the extension line of the lower surface FST1b of the first support FST1. In an embodiment, the first width W1 may be less than the second width W2.

The inner side surface FST1a of the first support FST1 defining or forming the first through hole TH1 may be a curved surface CR. Each through hole TH may be defined by more than one of the curved surfaces CR to define curved surfaces CR. While curved surfaces CR are illustrated along the width of the first through hole TH1 (e.g., along the first direction DR1), the curved surfaces CR may also be defined along the length of the first through hole TH1 (e.g., along the second direction DR2).

The curved surfaces CR provided or forming the inner side surfaces FST1a of the first support FST1 may each have a cross-sectional shape convex toward the first through hole TH1.

Further, a slope of each of the inner side surfaces FST1a of the first support FST1 may gradually increase from the point at which the extension line of the lower surface FST1b of the first support FST1 meets the lower surface FST1b to the point at which the extension line of the upper surface of the first support FST1 meets the upper surface of the first support FST1.

A cross-sectional surface shape of the inner side surface FST1a of the first support FST1 may be different from a cross-sectional surface shape of the upper surface of the first support FST1. In an embodiment, for example, the inner side surface FST1a of the first support FST1 may be an etched surface provided by an etching solution, and the upper surface of the first support FST1 may be a surface that is substantially not in contact with the etching solution so that the inner side surface FST1a of the first support FST1 which is etched by the etching solution, may include an uneven surface shape. The uneven surface shape may be, for example, an uneven surface having a wave shape, but the invention is not limited thereto.

As described above, in one or more embodiment of the display module DPM, the plurality of through holes TH are provided or formed in the first support FST1, and the extending direction of each of the through holes TH and the arrangement direction of the plurality of through holes TH (that is, the extending direction of the first group G1 and the second group G2) may be provided or formed to intersect or to be orthogonal to the first direction DR1 as the direction in which the display module DPM is rollable, so that the flexibility in the folding area FA may be secured. The short side length of each of the through holes TH1 and TH2 may be less than or equal to about 200 μm, and the long side length of each of the through holes TH1 and TH2 may be designed to be less than or equal to about 500 μm so that the visibility of the through holes TH1 and TH2 from outside the display device 1 and/or the display module DPM may be greatly reduced.

Further, since the support FST and the flexible substrate 110 may be mutually bonded without any intervening layer such as an adhesive layer interposed therebetween, there optical interfaces between a material which is interposed between the support FST and the flexible substrate 110, and each of the support FST and the flexible substrate 110 is obviated. Thus, visual recognition of the through holes TH in the support FST from outside the display device 1 and/or the display module DPM is reduced.

A method of manufacturing a display device 1 will be described below. In the following embodiments, components that are the same as those in the above-described embodiments will be referred to with the same reference numerals, and descriptions of the components will be omitted or simplified.

Figure 11:
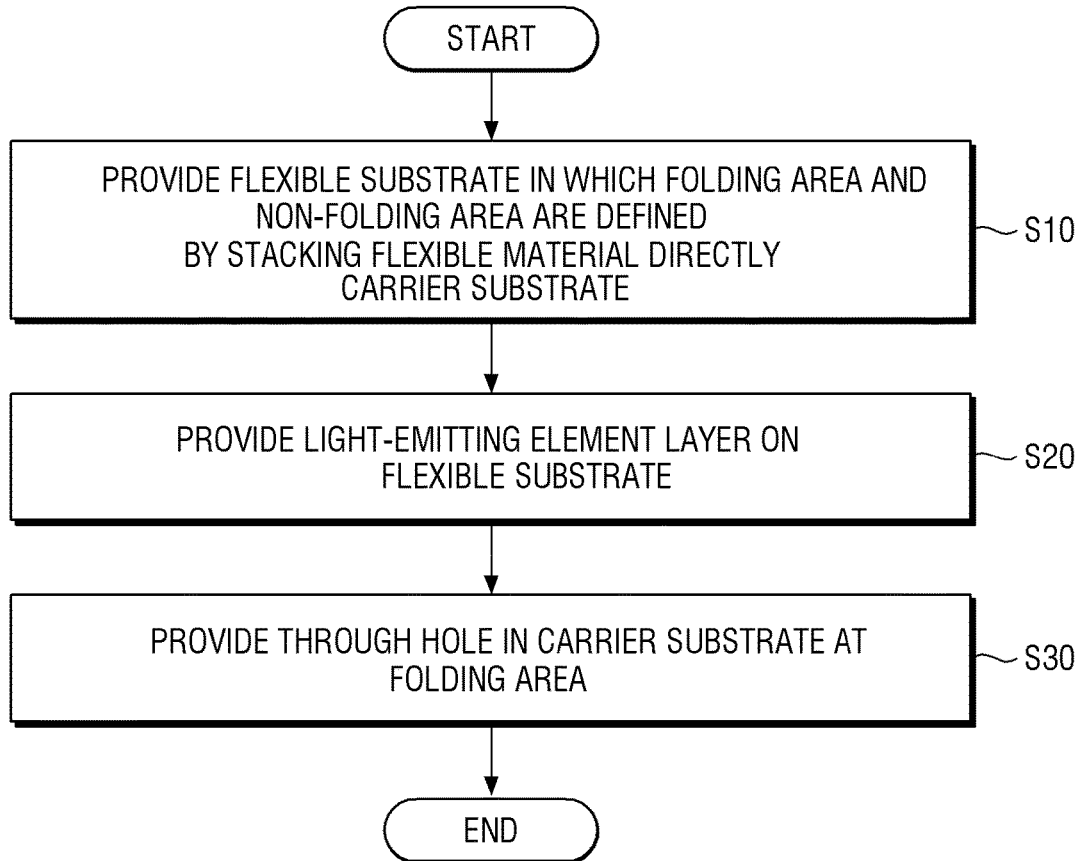
FIG. 11 is a flow chart of an embodiment of a method of providing a display device.

FIG. 11 is a flow chart of an embodiment of the method of manufacturing a display device 1. FIGS. 12 to 14 and 16 are cross-sectional views illustrating embodiments of processes of the method of manufacturing a display device 1. FIG. 15 is a plan view of an embodiment of a process of the method of manufacturing a display device 1.

Figure 12:
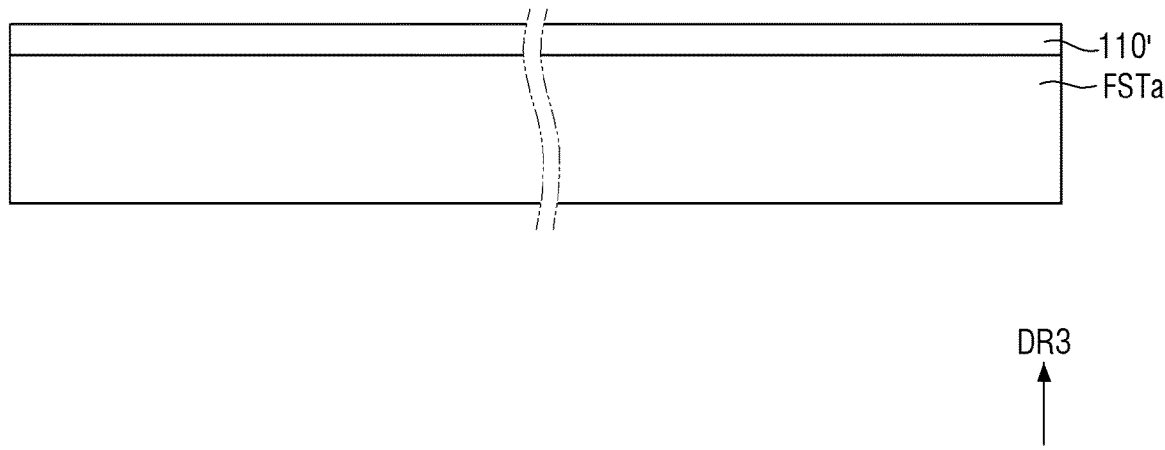
FIGS. 12 to 14 and 16 are cross-sectional views illustrating embodiments of processes of the method of providing a display device.

First, referring to FIGS. 11 and 12, a flexible material layer 110' is formed on a preliminary carrier substrate FSTa (S10).

The preliminary carrier substrate FSTa may include a material such as glass or quartz. The flexible material layer 110' may be provided or formed on the preliminary carrier substrate FSTa such by a lamination method. The preliminary carrier substrate FSTa may serve as a support layer for providing of the flexible material layer 110'.

The flexible material layer 110' may include or be made of an insulating material such as a flexible polymer resin. Examples of the polymer resin may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. In an embodiment, for example, the flexible material layer 110' may include polyimide ("PI"), but the invention is not limited thereto.

In the flexible material layer 110', a first area and a second area which is adjacent to the first area may be defined. The first area defined in the flexible material layer 110' may correspond to the folding area FA illustrated in FIG. 5, and the second area which is adjacent to the first area may correspond to the non-folding area NFA illustrated in FIG. 5. In an embodiment, for example, the first area may have exactly the same planar shape, planar area and position as the folding area FA, and the second area may have exactly the same planar shape, planar area and position as the non-folding area NFA. That is, after providing or forming through holes of the preliminary carrier substrate FSTa to be described later, the first area and the second area in the process of S10 may perform the same function as the folding area FA and the non-folding area NFA, respectively. Hereinafter, for convenience of description, the first area is referred to as the folding area FA, and the second area is referred to as the non-folding area NFA.

Referring to FIGS. 11 and 12, a circuit driving layer 120, a light-emitting element layer 130 and a thin-film encapsulation layer 140 are sequentially stacked on the flexible material layer 110' (S20), in order.

The circuit driving layer 120, the light-emitting element layer 130 and the thin-film encapsulation layer 140 have been described above with reference to FIG. 8, and thus detailed descriptions thereof will be omitted.

Figure 13:
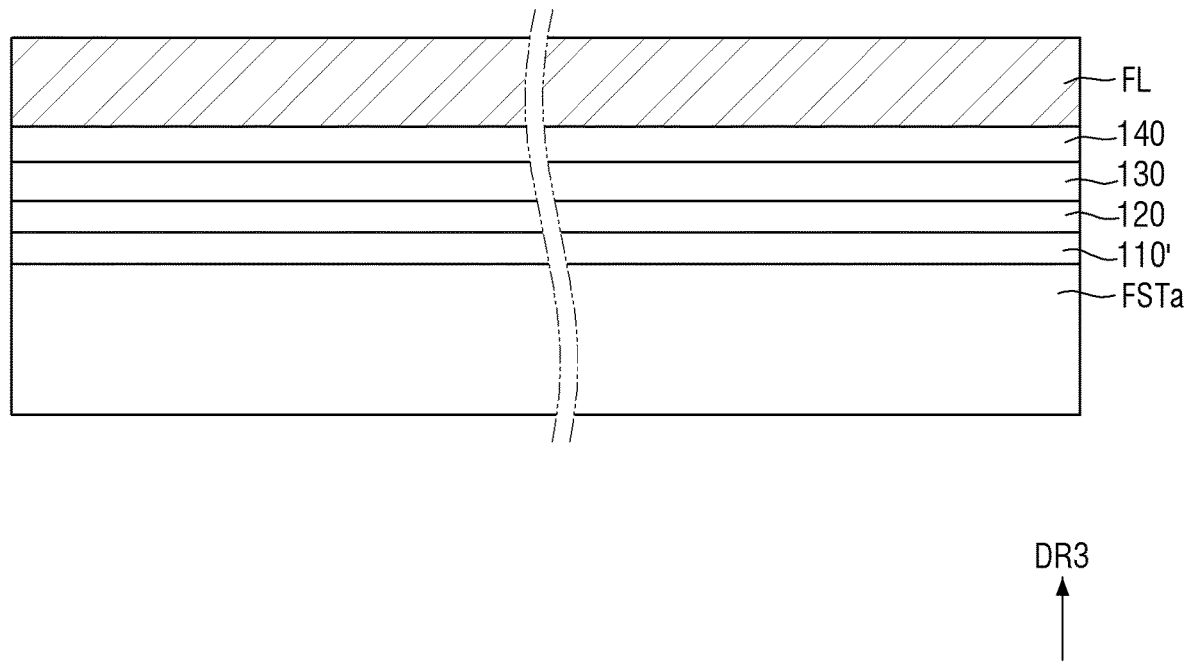

Referring to FIGS. 11 and 13, a release film FL is disposed on the thin-film encapsulation layer 140.

The release film FL may include a base substrate and an adhesive layer which is on the base substrate. In an embodiment, for example, the release film FL may be a single-sided tape. The adhesive layer of the release film FL may be attached to an upper surface of the thin-film encapsulation layer 140. The release film FL may be removable attached to the thin-film encapsulation layer 140.

When a touch layer is further disposed on the thin-film encapsulation layer 140 as described above with reference to FIG. 8, the release film FL may be attached to an upper surface of the touch layer.

The release film FL is initially attached to the upper surface of the thin-film encapsulation layer 140, and then is removed from the upper surface of the thin-film encapsulation layer 140 after the providing of the through holes TH in the preliminary carrier substrate FSTa to be described below. In order for the release film FL to be removable from the upper surface of the thin-film encapsulation layer 140, the adhesion between the adhesive layer of the release film FL and the thin-film encapsulation layer 140 is low. Furthermore, an adhesive layer residue of the release film FL does not remain on the upper surface of the thin-film encapsulation layer 140 after the release film FL is removed from the upper surface of the thin-film encapsulation layer 140.

Referring to FIGS. 8, 11, and 14 to 16, through holes TH are provided or formed in the preliminary carrier substrate FSTa (S30).

Figure 14:
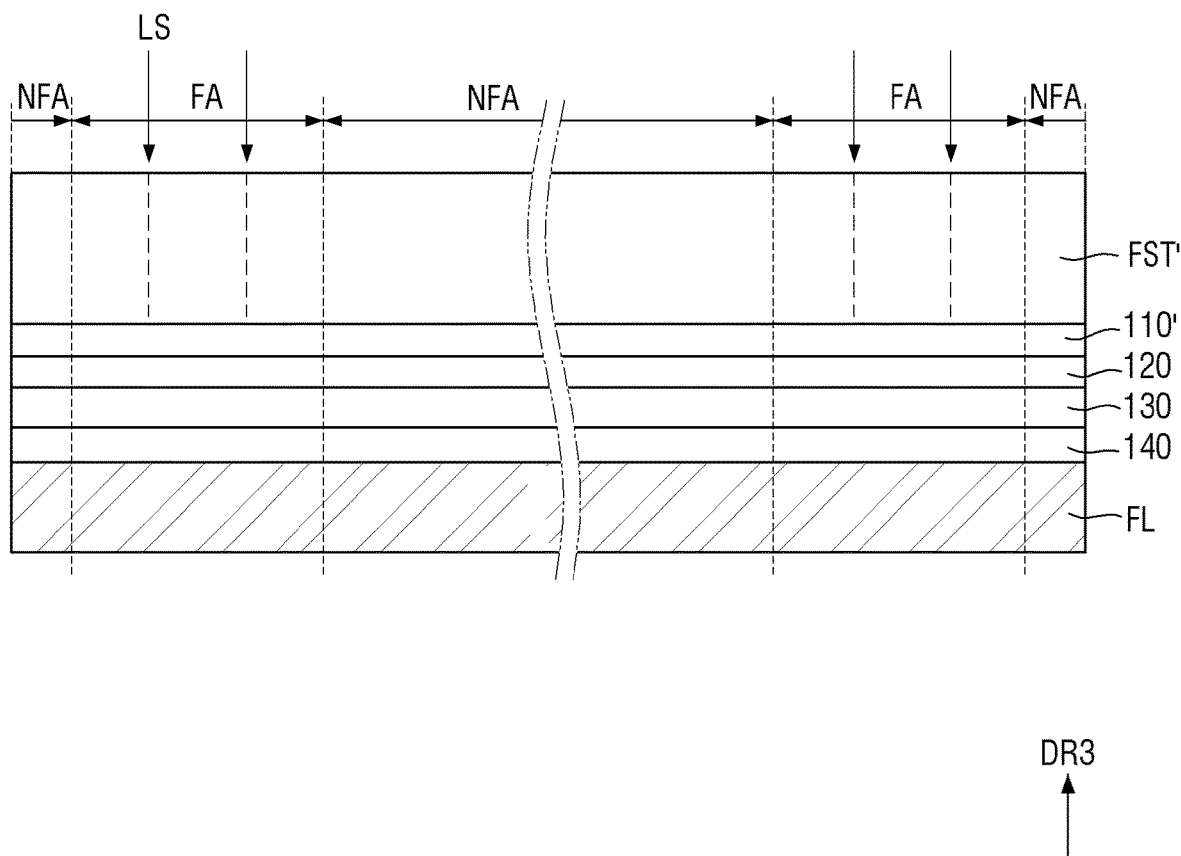
Figure 15:
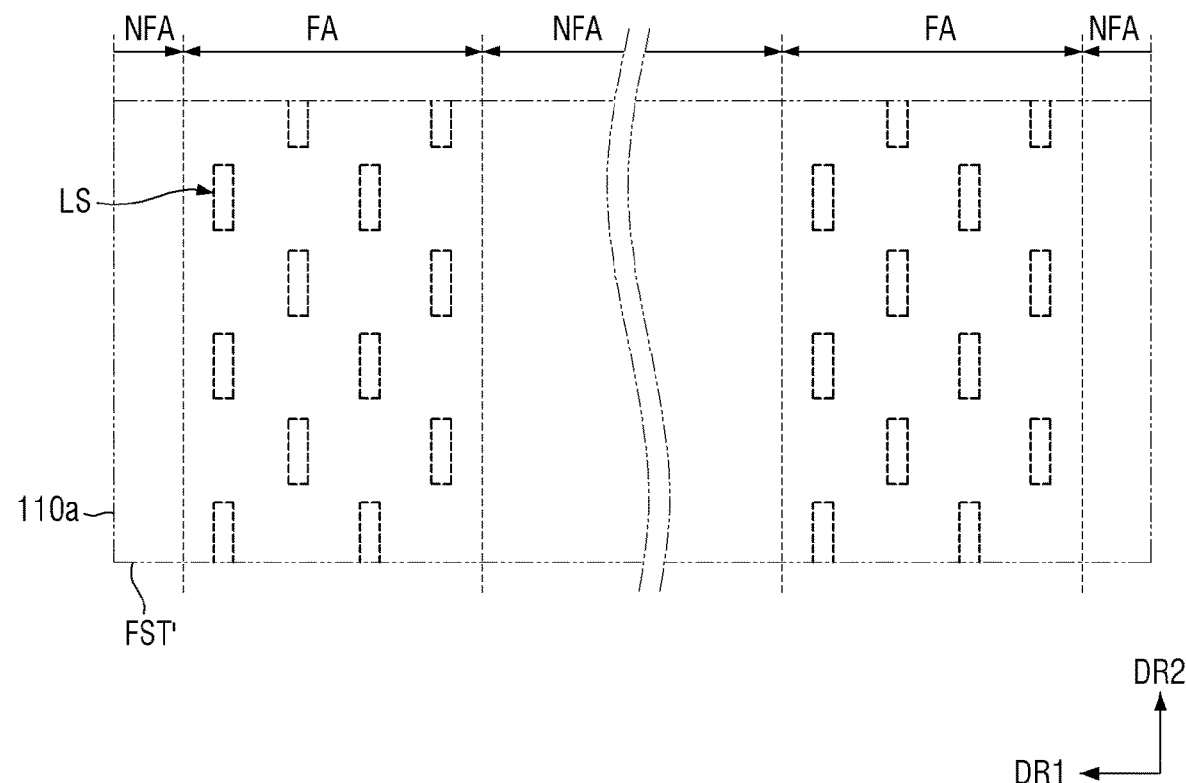
FIG. 15 is a plan view of an embodiment of a process in the method of providing a display device.

In forming of the through holes TH in the preliminary carrier substrate FSTa (S30), as shown in FIG. 14, a stacked structure in which the release film FL is located at an uppermost portion along a thickness direction, is vertically overturned compared to FIG. 13 so that the release film FL is located at a lowermost portion along the thickness direction. As shown in FIG. 14, the preliminary carrier substrate FSTa located at the lowermost portion along the thickness direction in FIG. 13 may be located at the uppermost portion along the thickness direction in FIG. 14.

A laser LS is irradiated onto the folding area FA of the preliminary carrier substrate FSTa from an upper side thereof along the thickness direction. In a plan view, the laser LS may be irradiated at locations of the preliminary carrier substrate FSTa which correspond to the through holes TH of FIG. 6.

The laser LS irradiated onto the locations corresponding to the through holes TH may be a femtosecond laser. As used herein, the "femtosecond laser" refers to a laser having a pulse width in a range of about 200 femtoseconds to about 500 femtoseconds. However, the laser LS is not limited thereto and may be light in a short wavelength range from a near-infrared ("IR") laser to an ultraviolet ("UV") laser or light in a multi-wavelength range including light in various wavelength ranges.

The laser LS may be irradiated in a direction from the uppermost surface of the preliminary carrier substrate FSTa to the lowermost surface thereof which is in contact with the flexible material layer 110'. A focus of the laser LS may be variously modified. In an embodiment, the focus of the laser LS may be provided at the lowermost surface of the preliminary carrier substrate FSTa, but the invention is not limited thereto.

When the laser LS is irradiated at the locations corresponding to the through holes TH, a carrier substrate FST' of FIG. 14 is provided or formed. The material constituting the carrier substrate FST' may undergo structural deformation in the planar areas onto which the laser LS is irradiated. In an embodiment, for example, Si—O bonds of the exemplified glass which forms the carrier substrate FST', may be broken in the corresponding planar areas. Thus, etching selectivity relative to the etching solution in the corresponding areas may be greater than etching selectivity relative to the etching solution in a planar area not irradiated with the laser LS.

In a plan view, a size of the planar area irradiated with the laser LS may be smaller than a final size of the planar area of the through hole TH described above with reference to FIG. 6.

Figure 16:
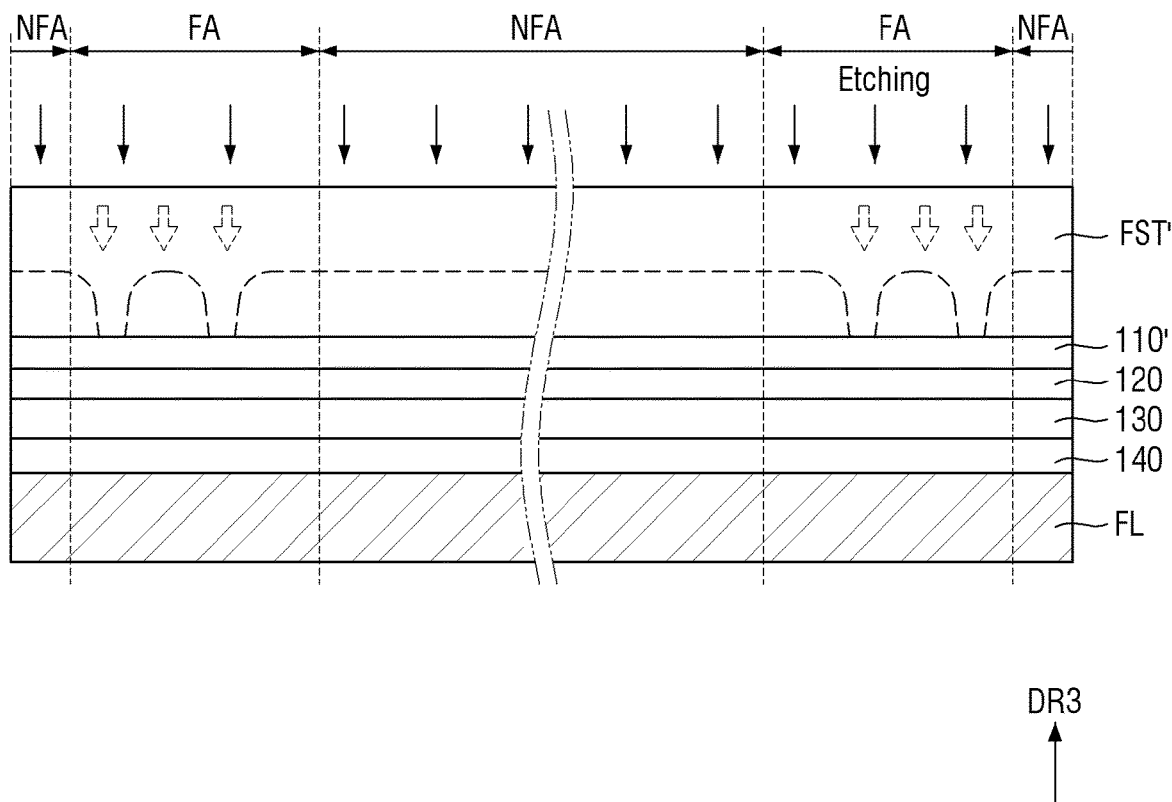

The carrier substrate FST' having the through holes TH by irradiation with the laser LS is etched. The etching may be a wet etching. As the etching solution in the etching operation, a basic solution such as potassium hydroxide (KOH) or sodium hydroxide (NaOH) or an acidic solution such as hydrofluoric acid (HF) may be used. As shown in FIG. 16, the wet etching may be performed over a whole surface of the carrier substrate FST'. The carrier substrate FST' is gradually etched from the uppermost portion by the etching solution so that a total thickness of the carrier substrate FST' may be decreased. As described above, the etching selectivity relative to the etching solution in the planar area irradiated with the laser LS may be greater than the etching selectivity relative to the etching solution in the planar area not irradiated with the laser LS. Accordingly, as a result of the wet etching, the through holes TH described above with reference to FIGS. 7 and 8 may be provided or formed in the corresponding planar areas irradiated with the laser LS.

In the etching of the carrier substrate FST', the etching selectivity relative to the etching solution of the carrier substrate FST' may be much greater than the etching selectivity of the flexible material layer 110'. Accordingly, in the etching of the carrier substrate FST', even when the etching solution is in contact with the flexible material layer 110', the first surface 110a of the flexible material layer 110' may not be substantially etched.

According to one or more embodiment of the manufacturing method, after the upper structure including the flexible material layer 110' is deposited on the preliminary carrier substrate FSTa, the preliminary carrier substrate FSTa is not peeled off from the flexible material layer 110'. When the upper structure is deposited, the preliminary carrier substrate FSTa serving as the support layer is not removed after the deposition process and remains at a lowermost end of the display module DPM, thereby improving the flatness of a thinned display module. In addition, the through holes TH are provided or formed in the folding area FA of the carrier substrate FST' to provide the support FST (in FIG. 8) from the carrier substrate FST' which is etched, thereby imparting flexibility to the folding area FA of the display module DPM. That is, the support FST having the through holes TH includes an etched carrier substrate.

Figure 17:
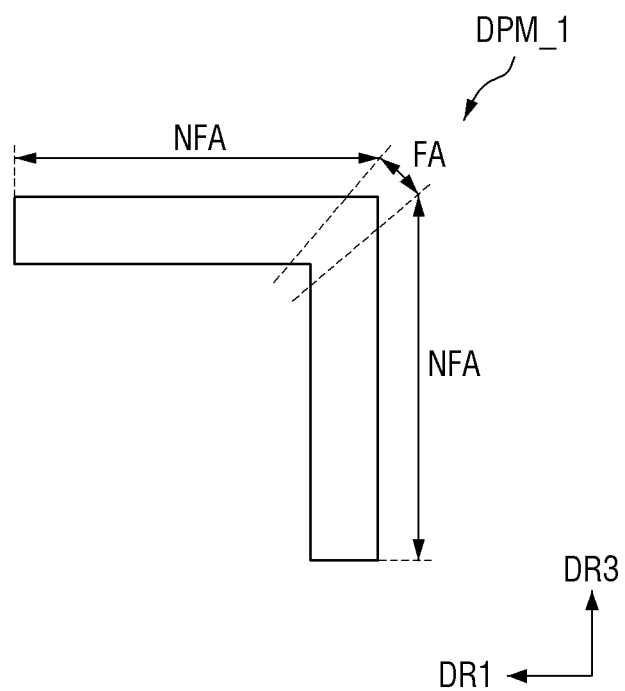
FIG. 17 is a cross-sectional view of an embodiment of a display module.
Figure 18:
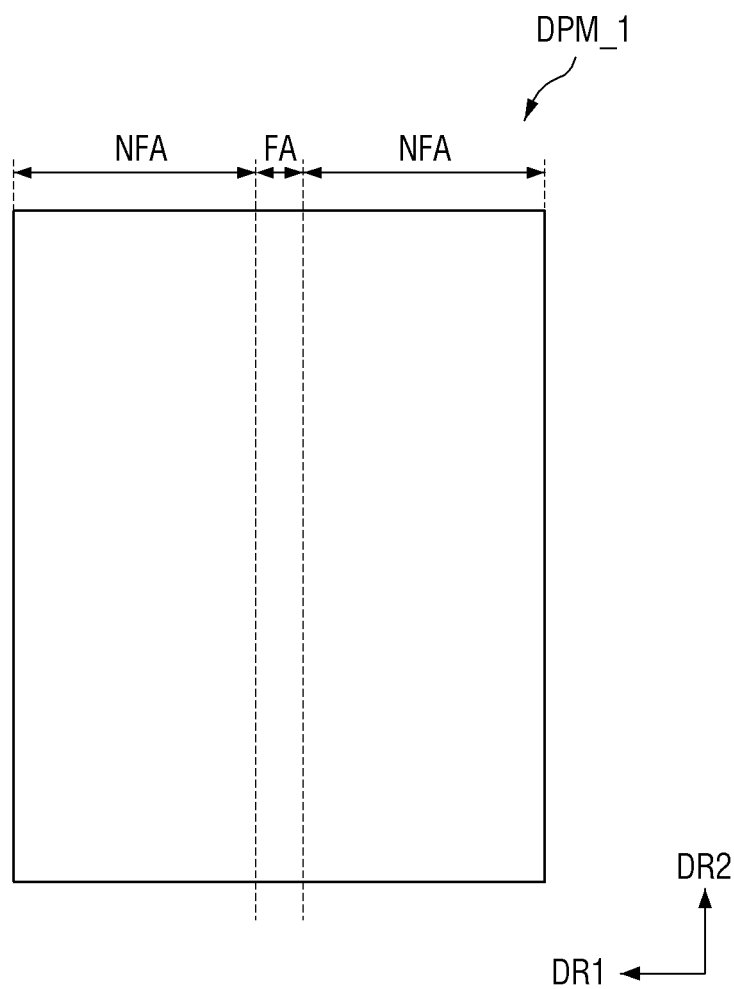
FIG. 18 is a plan view of the display module in FIG. 17.

FIG. 17 is a cross-sectional view of an embodiment of a display module DPM_1. FIG. 18 is a plan view of the display module DPM_1.

Referring to FIGS. 17 and 18, a display module DPM_1 is different from the display module DPM in that one of the folding area FA and two of the non-folding areas NFA which are respectively on opposing sides of the folding area FA are defined.

In more detail, in the display module DPM_1, one of the folding area FA and two of the non-folding areas NFA define an entirety of a planar area of the display module DPM_1. A display device 1 including the display module DPM_1 may be a foldable display device.

The arrangement and shape of a support FST are the same as those described with reference to FIGS. 6 to 8, and thus a duplicate description will be omitted below.

Figure 19:
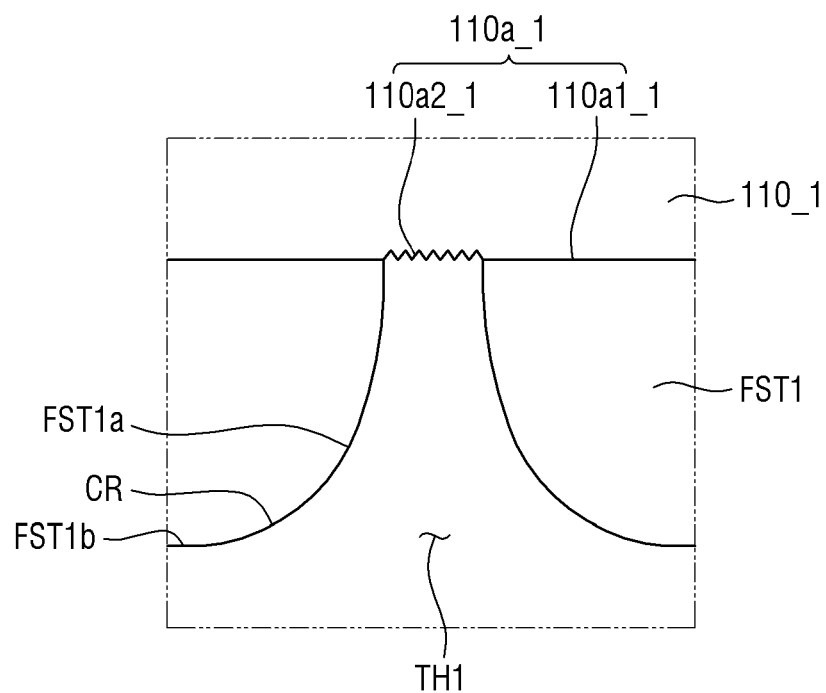
FIG. 19 is an enlarged cross-sectional view of an embodiment of a flexible substrate and a first support.

FIG. 19 is an enlarged cross-sectional view of an embodiment of a flexible substrate 110_1 and a first support FST1.

Referring to FIG. 19, a flexible substrate 110_1 is different from the flexible substrate 110 illustrated with reference to FIG. 10 in that a first surface 110a_1 of the flexible substrate 110_1 which is closest to the support FST includes a first portion 110a1_1 and a second portion 110a2_1.

In more detail, the first surface 110a_1 of the flexible substrate 110_1 may include the first portion 110a1_1 and the second portion 110a2_1. A surface roughness of the first portion 110a1_1 may be smaller than a surface roughness of the second portion 110a2_1. The second portion 110a2_1 may be provided or formed by partially etching the first surface 110a_1 (or the second portion 110a2_1) of the flexible substrate 110_1 which is exposed to outside the first support FST1 by the first through hole TH1 with an etching solution in an etching operation.

As described above, the surface roughness of an inner side surface FST1a of the first support FST1 may be smaller than the surface roughness of an upper surface of the first support FST1. The inner side surface FST1a of the first support FST1 may be a surface etched by an etching solution, and the upper surface of the first support FST1 may be a surface that is substantially not in contact with the etching solution. As such, the inner side surface FST1a of the first support FST1 which is etched by the etching solution, may have a surface roughness greater than the upper surface of the first support FST1 that is not substantially in contact with the etching solution.

Since other features have been described above with reference to FIG. 10, a duplicate description will be omitted below.

Figure 20:
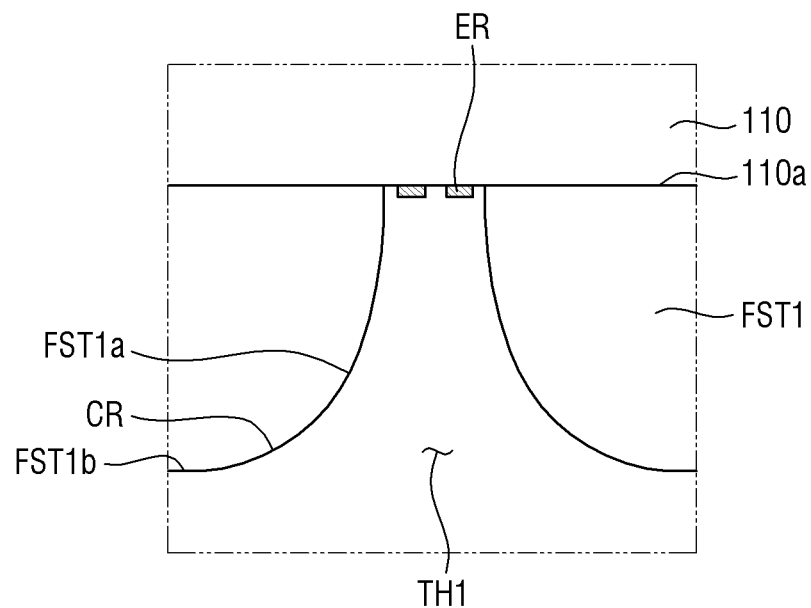
FIG. 20 is an enlarged cross-sectional view of an embodiment of a flexible substrate and a first support.

FIG. 20 is an enlarged cross-sectional view of a flexible substrate 110 and a first support FST1.

Referring to FIG. 20, an etching solution residue ER may remain on the first surface 110a of a flexible substrate 110 at a first through hole TH1.

In more detail, the etching solution residue ER may remain on the first surface 110a of the flexible substrate 110 at the first through hole TH1 since residue of the etching solution is not completely removed from an exposed surface of the flexible substrate 110 after the first through hole TH1 is provided by etching.

Since other features have been described above with reference to FIG. 10, a duplicate description will be omitted below.

Figure 21:
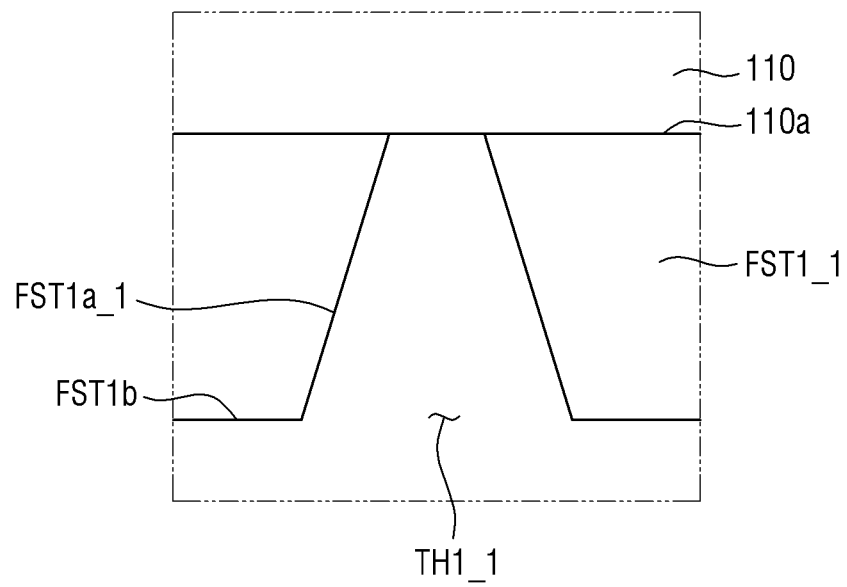
FIG. 21 is an enlarged cross-sectional view of an embodiment of a flexible substrate and a first support.

FIG. 21 is an enlarged cross-sectional view of an embodiment of a flexible substrate 110 and a first support FST1_1.

Referring to FIG. 21, a first support FST1_1 is different from the first support FST1 with reference to FIG. 10 in that a cross-sectional shape of a slope of an inner side surface FST1*a*_1 of the first support FST1_1 is a straight-line shape (e.g., linear).

In more detail, the cross-sectional shape of the slope of the inner side surface FST1*a*_1 of the first support FST1_1 may be a straight-line shape. In an embodiment, for example, the inclination angle of the inner side surface FST1*a*_1 of the first support FST1_1 may be constant.

The inclination angle and slope of the inner side surface FST1*a*_1 of the first support FST1_1 may be provided or formed by adjusting an etching solution and/or an etching time when a first through hole TH1_1 is formed.

In an embodiment, dry etching may be used in providing or forming of the first through hole TH1_1 defined by the inner side surface FST1*a*_1 of the first support FST1_1.

Since other features have been described above with reference to FIG. 10, a duplicate description will be omitted below.

Figure 22:
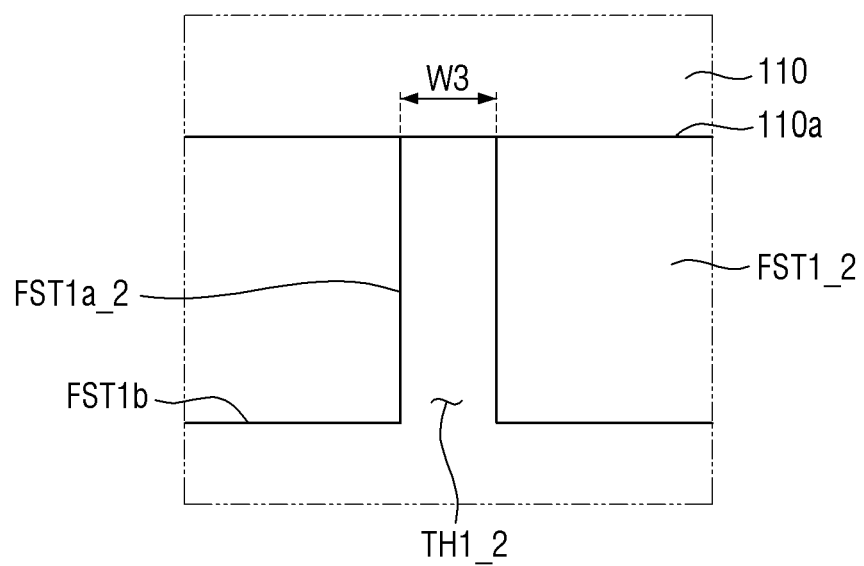
FIG. 22 is an enlarged cross-sectional view of an embodiment of a flexible substrate and a first support.

FIG. 22 is an enlarged cross-sectional view of an embodiment of a flexible substrate 110 and a first support FST1_2.

Referring to FIG. 22, a first support FST1_2 is different from the first support FST1 with reference to FIG. 10 in that a third width W3 of a first through hole TH1_2 at an upper surface of the first support FST1_2 is equal to a width at a lower surface FST1*b* of the first support FST1_2. That is, the third width W3 of a first through hole TH1_2, is equal to a length of an extension line of the upper surface of the first support FST1_2 and is equal to a length of an extension line of the lower surface FST1*b* of the first support FST1_2.

In more detail, the first through hole TH1_2 has a third width W3 and the third width W3 may be the same along the third direction DR3 from the extension line of the upper surface of the first support FST1_2 to the lower surface FST1*b* of the first support FST1_2. That is, the third width W3 may be the same in a direction from the lower surface FST1*b* of the first support FST1_2 to the upper surface thereof.

The first through hole TH1_2 having the third width W3 may be providing by dry etching.

Since other features have been described above with reference to FIG. 10, a duplicate description will be omitted below.

Figure 23:
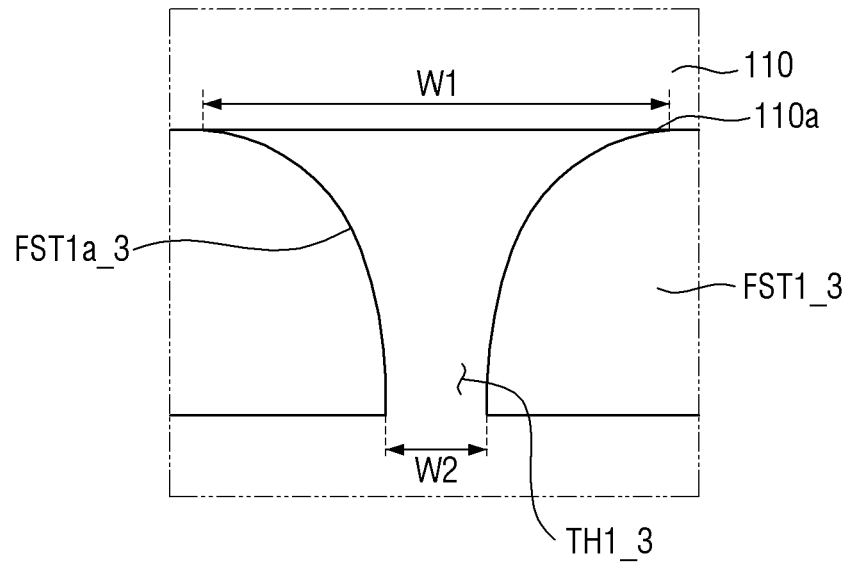
FIG. 23 is an enlarged cross-sectional view of an embodiment of a flexible substrate and a first support.

FIG. 23 is an enlarged cross-sectional view of a flexible substrate 110 and a first support FST1_3.

Referring to FIG. 23, a first support FST1_3 is different from the first support FST1 with reference to FIG. 10 in that a first width W1 of a first through hole TH1_3 is greater than a second width W2 of the first through hole TH1_3.

In more detail, a slope of an inner side surface FST1*a*_3 of the first support FST1_3 may gradually decrease from a point at which an extension line of a lower surface FST1*b* of the first support FST1_3 meets the lower surface FST1*b* to a point at which an extension line of an upper surface of the first support FST1_3 meets the upper surface of the first support FST1_3.

Since other features have been described above with reference to FIG. 10, a duplicate description will be omitted below.

Figure 24:
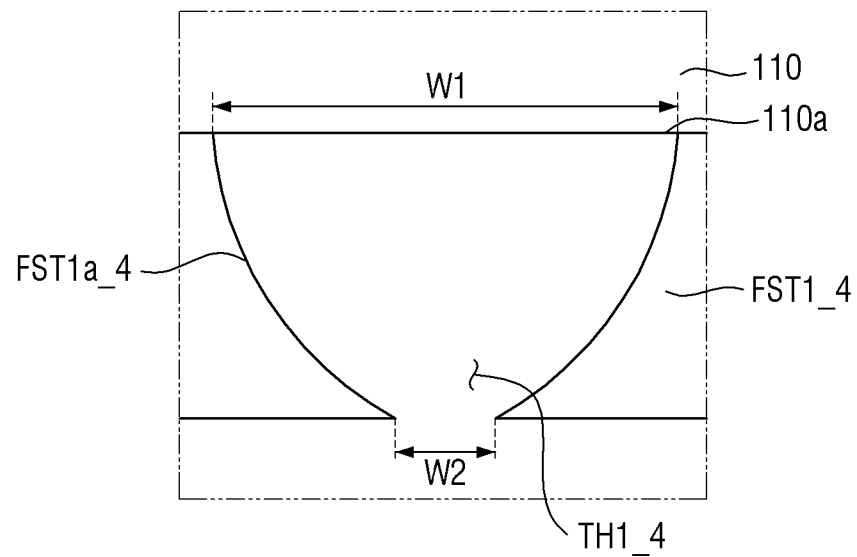
FIG. 24 is an enlarged cross-sectional view of an embodiment of a flexible substrate and a first support.

FIG. 24 is an enlarged cross-sectional view of a flexible substrate 110 and a first support FST1_4.

Referring to FIG. 24, a first support FST1_4 is different from the first support FST1_3 with reference to FIG. 23 in that each of the curved surfaces CR formed by an inner side surface FST1*a*_4 of a first through hole TH1_4 of the first support FST1_4 has a cross-sectional shape convex in a direction opposite to the first through hole TH1_4.

Since other features have been described above with reference to FIGS. 10 and 23, a duplicate description will be omitted below.

Figure 25:
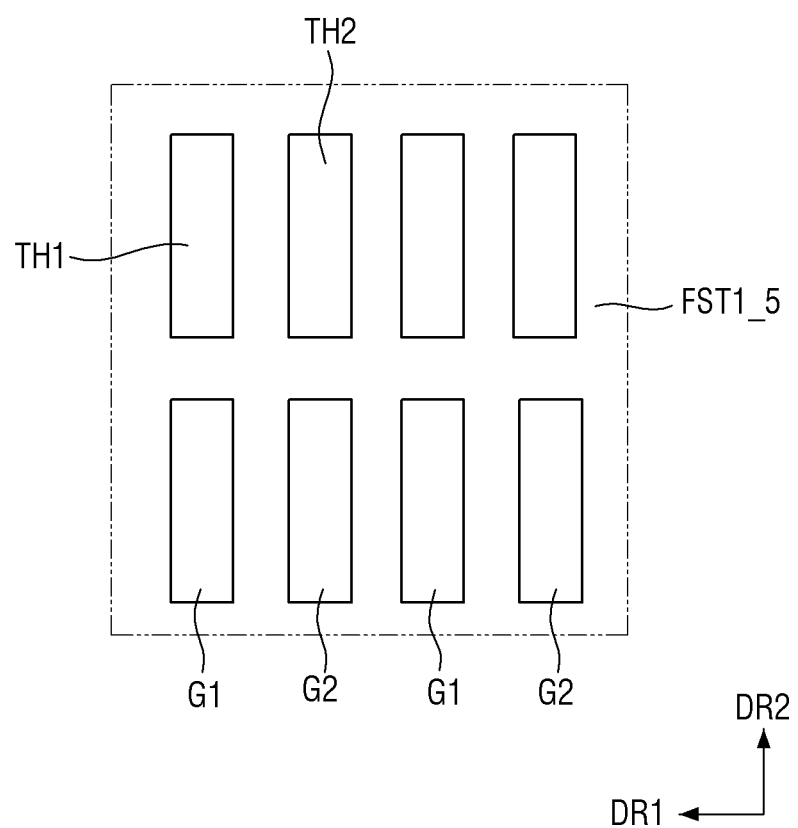
FIG. 25 is a plan view of an embodiment of a first support.

FIG. 25 is a plan view of an embodiment of a first support FST1_5.

Referring to FIG. 25, a first support FST1_5 is different from the first support FST1 with reference to FIG. 7 in that a first separation space between first through holes TH1 within a first group G1 which are adjacent to each other along the second direction DR2, does not overlap (e.g., is not aligned with) a second through hole TH2 of a second group G2 which is adjacent to the first separation space along the first direction DR1, along the first direction DR1, and a second separation space between second through holes TH2 within the second group G2 which are adjacent to each other along the second direction DR2 does not overlap the first through hole TH1 of the first group G1 which is adjacent to the second separation space along the first direction DR1, along the first direction DR1.

In more detail, in the first support FST1_5, the first separation space between the first through holes TH1 within the first group G1 which are adjacent to each other along the second direction DR2, may be misaligned with the second through hole TH2 within the second group G2 which is adjacent to the first separation space in the first direction DR1, along the first direction DR1. Also, the second separation space between the second through holes TH2 within the second group G2 which are adjacent to each other along the second direction DR2, may not overlap the first through hole TH1 of the first group G1 which is adjacent to the second separation space along the first direction DR1, along the first direction DR1.

Since other features have been described above with reference to FIG. 7, a duplicate description will be omitted below.

Figure 26:
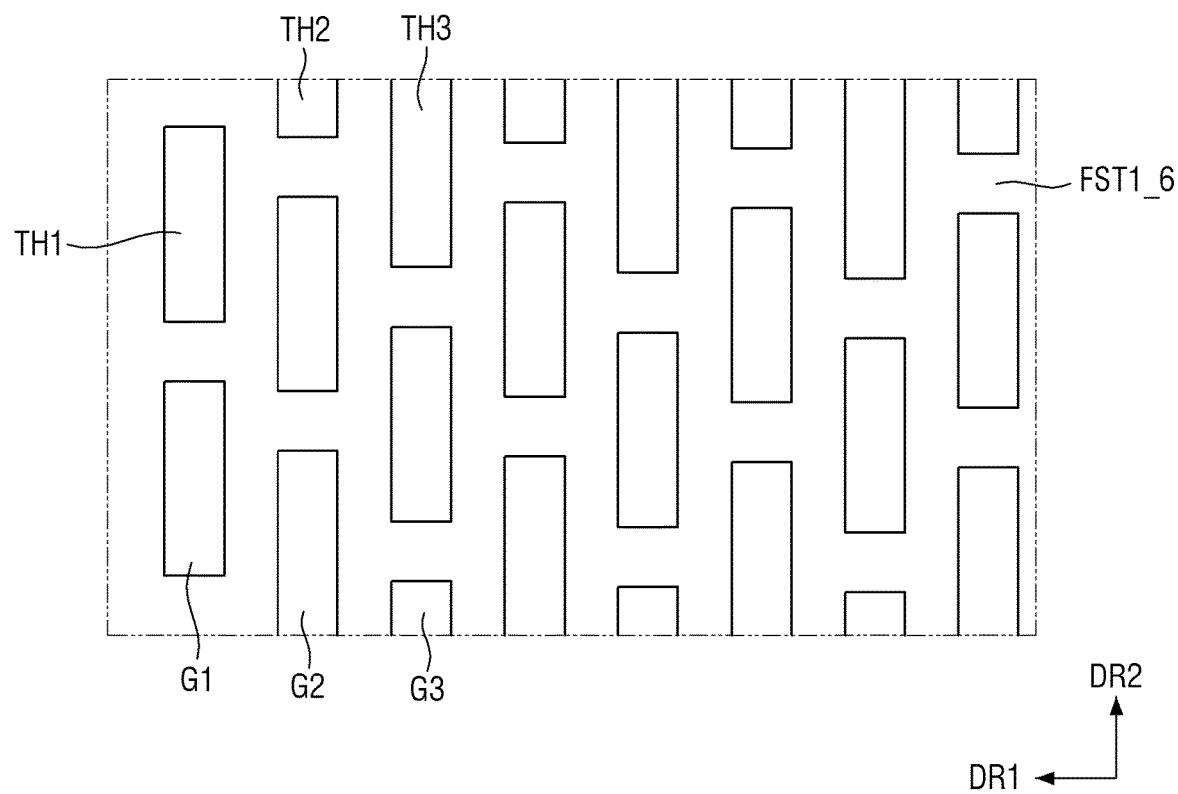
FIG. 26 is a plan view of an embodiment of a first support.

FIG. 26 is a plan view of an embodiment of a first support FST1_6.

Referring to FIG. 26, a first support FST1_6 is different from the first support FST1 with reference to FIG. 7 in that a third group G3 of through holes TH which includes a third through hole TH3 provided in plural including a plurality of third through holes TH3 arranged along the second direction DR2 is further disposed between a first group G1 including first through holes TH1 arranged along the second direction DR2, and a second group G2 including second through holes TH2 arranged along the second direction DR2.

In more detail, in the first support FST1_6, the third group G3 including the plurality of third through holes TH3 arranged along the second direction DR2 may be further disposed between the first group G1 including the first through holes TH1 arranged along the second direction DR2, and the second group G2 including the second through holes TH2 arranged along the second direction DR2.

The through holes TH of the third group G3 may be disposed to be staggered with the through holes TH of each of the first group G1 and the second group G2.

The planar shape and cross-sectional shape of each of the third through holes TH3 within the third group G3 are the same as or similar to those of the first through hole TH1, and thus a duplicate description will be omitted.

Since other features have been described above with reference to FIG. 7, a duplicate description will be omitted below.

Figure 27:
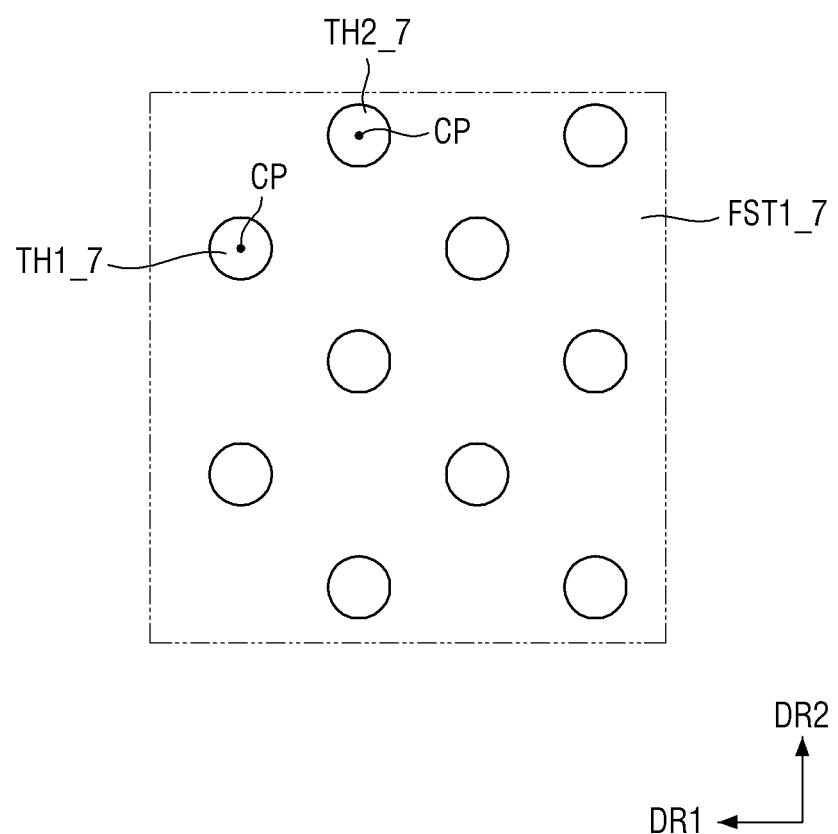
FIG. 27 is a plan view of an embodiment of a first support.

FIG. 27 is a plan view of an embodiment of a first support FST_7.

Referring to FIG. 27, a first support FST1_7 is different from the first support FST1 with reference to FIG. 7 in that planar shapes of a first through hole TH1_7 and a second through hole TH2_7 of the first support FST1_7 are different from those of the first through hole TH1 and the second through hole TH2 illustrated in FIG. 7, respectively.

In more detail, the planar shape of each of the through holes TH1_7 and TH2_7 may be symmetrical along the first direction DR1 and along the second direction DR2 with respect to a center point CP.

In an embodiment, for example, the planar shape of each of the through holes TH1_7 and TH2_7 may be a circular shape.

In an embodiment, for example, a distance from the center point CP to an edge of each of the through holes TH1_7 and TH2_7 along the first direction DR1 may be equal to a distance from the center point CP to an edge of each of the through holes TH1_7 and TH2_7 along the second direction DR2.

According to one or more embodiment, the planar shape of each of the through holes TH which is symmetrical along directions which cross each other with respect to a center point CP imparts flexibility to a display module DPM not only in rolling of the display module DPM along the first direction DR1 but also in rolling of the display module DPM along the second direction DR2.

Since other features have been described above with reference to FIG. 7, a duplicate description will be omitted below.

Figure 28:
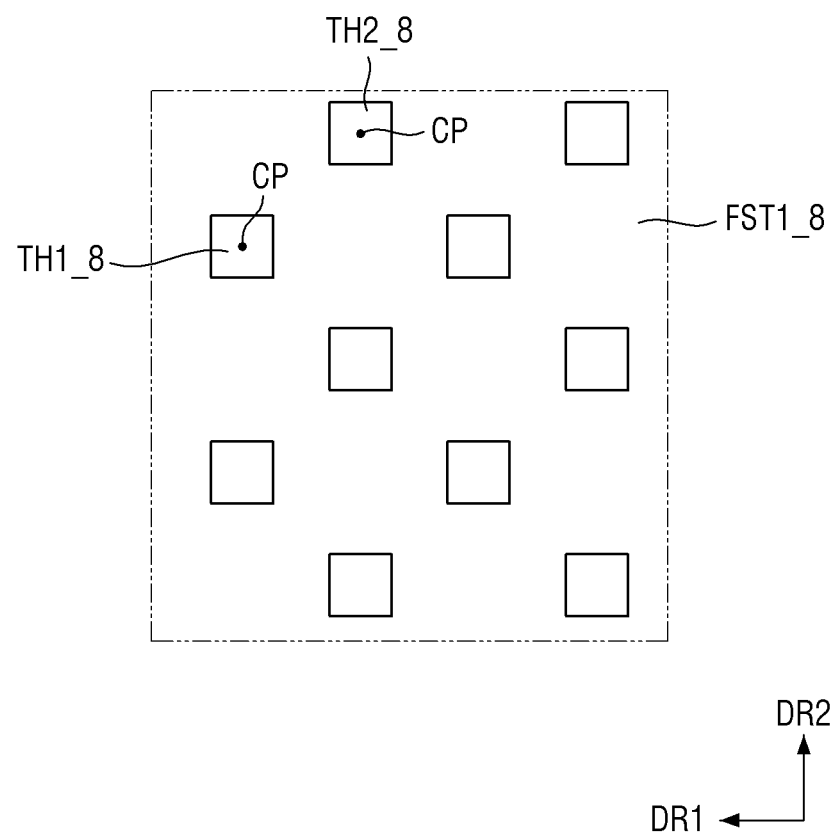
FIG. 28 is a plan view of an embodiment of a first support.

FIG. 28 is a plan view of a first support FST1_8.

Referring to FIG. 28, a first support FST1_8 is different from the first support FST1 with reference to FIG. 7 in that that planar shapes of a first through hole TH1_8 and a second through hole TH2_8 of the first support FST1_7 are different from those of the first through hole TH1 and the second through hole TH2 illustrated in FIG. 7, respectively.

In more detail, the planar shape of each of the through holes TH1_8 and TH2_8 of the first support FST1_8 may be symmetrical along the first direction DR1 and along the second direction DR2 with respect to the center point CP and may be a square shape.

Since other features have been described above with reference to FIGS. 7 and 27, a duplicate description will be omitted below.

Figure 29:
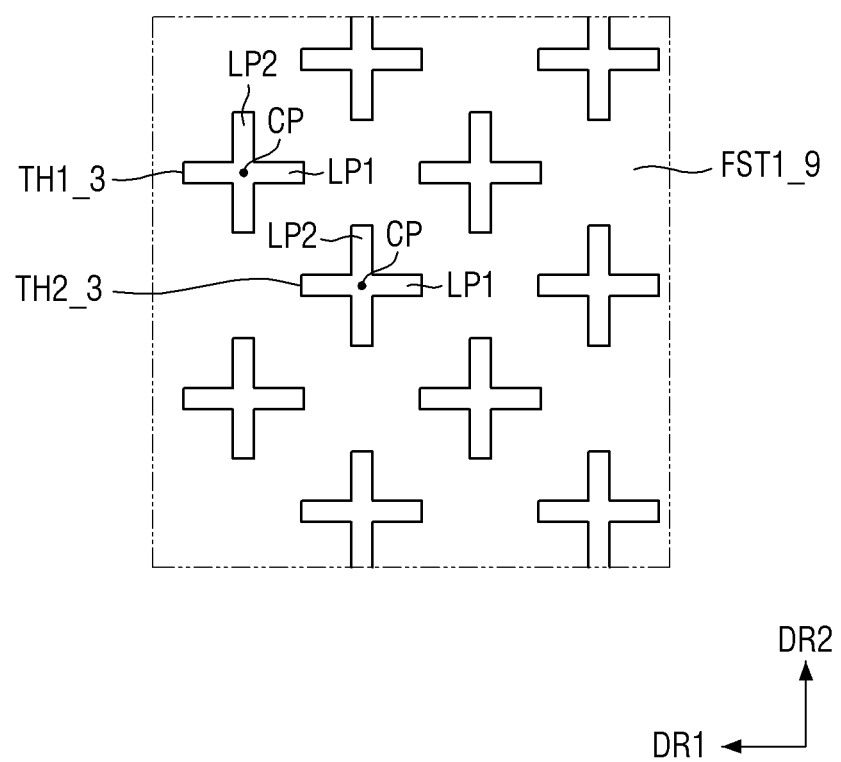
FIG. 29 is a plan view of an embodiment of a first support.

FIG. 29 is a plan view of an embodiment of a first support FST_9.

Referring to FIG. 29, a first support FST1_9 is different from the first support FST1_7 with reference to FIG. 27 in that a planar shape of each of through holes TH1_3 and TH2_3 of the first support FST1_9 includes a first line portion LP1 extending along the first direction DR1 and a second line portion LP2 extending along the second direction DR2, where the first line portion LP1 and the second line portion LP2 intersect each other such as to form a cross-shape or an X-shape. The line portions may intersect each other at the center point CP.

In more detail, the planar shape of each of the through holes TH1_3 and TH2_3 of the first support FST1_9 may include the first line portion LP1 extending along the first direction DR1 and the second line portion LP2 extending along the second direction DR2, and the first line portion LP1 and the second line portion LP2 may intersect each other.

A distance from a center point CP of the through hole to a distal end of the first line portion LP1 which is furthest from the center point CP may be equal to a distance from the center point CP to a distal end of the second line portion LP2 which is furthest from the center point CP.

According to one or more embodiment, the planar shape of each of the through holes TH which has equal distances along directions which cross each other with respect to a center point CP imparts flexibility to a display module DPM not only in rolling of the display module DPM along the first direction DR1 but also in rolling of the display module DPM along the second direction DR2.

Since other features have been described above with reference to FIGS. 7 and 27, a duplicate description will be omitted below.

Figure 30:
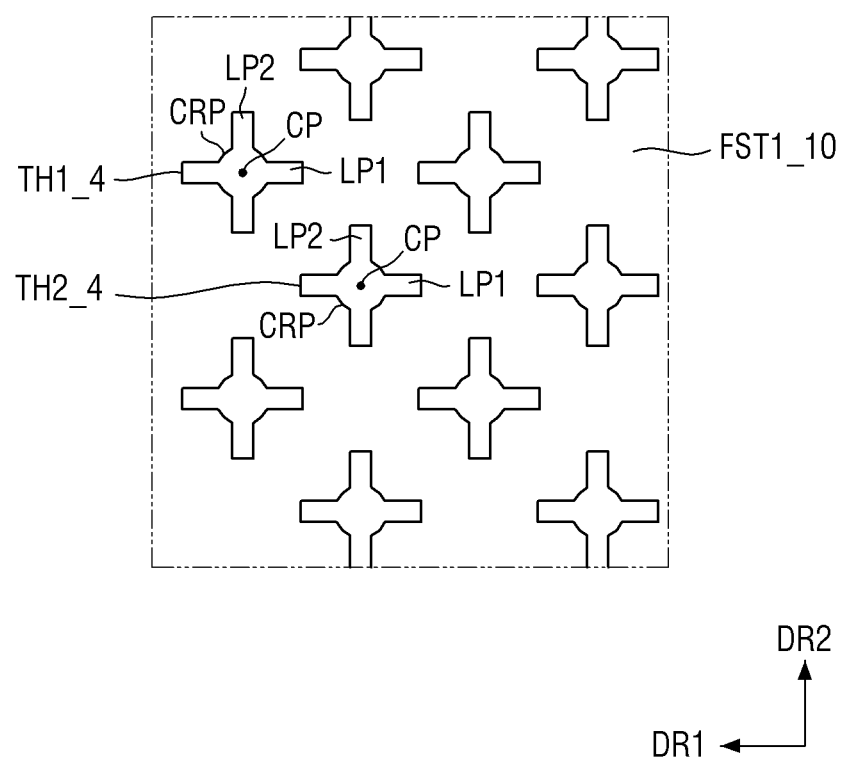
FIG. 30 is a plan view of an embodiment of a first support.

FIG. 30 is a plan view of an embodiment of a first support FST1_10.

Referring to FIG. 30, a first support FST1_10 is different from the first support FST1_9 with reference to FIG. 29 in that a planar shape of each of through holes TH1_4 and TH2_4 of the first support FST1_10 further includes a curved line portion CRP protruding outward from an intersection of a first line portion LP1 and a second line portion LP2.

In more detail, the planar shape of each of the through holes TH1_4 and TH2_4 of the first support FST1_10 may further include the curved line portion CRP protruding outward from the intersection of the first line portion LP1 and the second line portion LP2.

The curved line portion CRP protruding outward from the intersection of the first line portion LP1 and the second line portion LP2 may be provided or formed by further etching at the corresponding intersection while the through holes TH1_4 and TH2_4 of the first support FST1_10 are provided or formed.

According to one or more embodiment, a flexible display device is provided with reduced pattern visibility and a method of providing the same.

Effects according to the embodiments are not limited by the content exemplified above, and more various effects are included in the present specification.

While the embodiments of the invention have been described with reference to the accompanying drawings, it should be understood by those skilled in the art that various modifications may be made without departing from the scope of the invention and without changing essential features thereof. Therefore, the above-described embodiments should be understood to be exemplary and not limiting.

What is claimed is:
1. A display device comprising:
   a flexible substrate comprising:
      a folding area at which the flexible substrate is bendable,
      a non-folding area adjacent to the folding area along a first direction,
      the folding area and the non-folding area each provided in plurality including folding areas and non-folding areas, respectively, and
      the folding areas and the non-folding areas repeatedly arranged along the first direction;
   a light-emitting element layer on a first surface of the flexible substrate; and
   a support on a second surface of the flexible substrate which is opposite to the first surface, the support being bendable together with the flexible substrate,
   wherein the support includes:
      a first portion corresponding to the folding area,
      a second portion corresponding to the non-folding area, and a through hole extended through the first portion of the support, and wherein the support includes a glass material.

2. The display device of claim 1, wherein a portion of the second surface of the flexible substrate is exposed to outside the support by the through hole in the first portion of the support.

3. A display device comprising:
a flexible substrate comprising:
a folding area at which the flexible substrate is bendable, and
a non-folding area adjacent to the folding area along a first direction;
a light-emitting element layer on a first surface of the flexible substrate; and
a support on a second surface of the flexible substrate which is opposite to the first surface, the support being bendable together with the flexible substrate,
wherein the support includes:
a first portion corresponding to the folding area,
a second portion corresponding to the non-folding area,
a through hole extended through the first portion of the support, and
the through hole excluded from the second portion of the support, and
wherein the support includes a glass material.

4. The display device of claim 3, wherein
the through hole includes a planar shape defined along the first direction and along a second direction which intersects the first direction, and
the planar shape of the through hole is a line shape having a major dimension along the second direction.

5. The display device of claim 4, wherein within the folding area of the flexible substrate,
the through hole is providing in plural including a plurality of through holes, and
the plurality of through holes are arranged along the second direction to form a through hole group.

6. The display device of claim 5, wherein within the folding area of the flexible substrate,
the through hole group is provided in plural including a plurality of through hole groups,
the plurality of through hole groups includes:
a first through hole group including first through holes, and
a second through hole group which is adjacent to the first through hole group along the first direction and includes second through holes, and
the first through holes of the first through hole group and the second through holes of the second through hole group are arranged in a staggered manner.

7. The display device of claim 6, wherein within the folding area of the flexible substrate, a first through hole among the first through holes of the first through hole group is misaligned with a second through hole among the second through holes of the second through hole group along the first direction.

8. The display device of claim 6, wherein within the folding area of the flexible substrate,
the first through hole group and the second through hole group are each provided in plural including first through hole groups and second through hole groups, respectively, and
the first through hole groups and the second through hole groups are repeatedly arranged along the first direction.

9. The display device of claim 3, wherein
the through hole includes a planar shape defined along the first direction and along a second direction which intersects the first direction, the planar shape having a center point, and
a length from the center point to an edge of the through hole along the first direction is equal to a length from the center point to an edge of the through hole along the second direction.

10. The display device of claim 9, wherein
the planar shape of the through hole includes a first line portion extending along the first direction and a second line portion extending along the second direction, and
the first line portion and the second line portion intersect each other at the center point.

11. The display device of claim 9, wherein
a first portion of the second surface of the flexible substrate is exposed to outside the support by the through hole in the first portion of the support,
the first portion of the support includes:
an upper surface which forms an interface with the second surface of the flexible substrate,
a lower surface which is furthest from the upper surface of the first portion of the support, and
a side surface which connects the upper surface to the lower surface, and
the through hole penetrates the upper surface of the first portion of the support and the lower surface of the first portion of the support.

12. The display device of claim 11, wherein
the through hole includes a width along the first direction, and
the width of the through hole decreases in a direction from the lower surface of the first portion of the support to the upper surface of the first portion of the support.

13. The display device of claim 12, wherein
the side surface of the first portion of the support has a slope, and
the slope of the side surface increases in the direction from the lower surface of the first portion of the support to the upper surface of the first portion of the support.

14. The display device of claim 11, wherein
the through hole includes a width along the first direction, and
the width of the through hole is constant in a direction from the lower surface of the first portion of the support to the upper surface of the first portion of the support.

15. The display device of claim 11, wherein
the through hole includes a width along the first direction, and
the width of the through hole increases in a direction from the lower surface of the first portion of the support to the upper surface of the first portion of the support.

16. The display device of claim 3, wherein
a first portion of the second surface of the flexible substrate is exposed to outside the support by the through hole in the first portion of the support,
the first portion of the second surface of the flexible substrate which is exposed to outside the support has a surface roughness,
a second portion of the second surface of the flexible substrate is adjacent to the through hole and has a surface roughness, and
the surface roughness of the first portion of the second surface of the flexible substrate is greater than the surface roughness of the second portion of the second surface of the flexible substrate.

17. The display device of claim 3, wherein
a first portion of the second surface of the flexible substrate is exposed to outside the support by the through hole in the first portion of the support, and
the display device further comprises an etching solution residue in the through hole and in contact with the first portion of the second surface of the flexible substrate which is exposed to outside the support by the through hole.

* * * * *